United States Patent
Miyase et al.

(10) Patent No.: US 12,020,927 B2
(45) Date of Patent: *Jun. 25, 2024

(54) METHOD FOR MANUFACTURING SILICON CARBIDE EPITAXIAL SUBSTRATE AND METHOD FOR MANUFACTURING SILICON CARBIDE SEMICONDUCTOR DEVICE

(71) Applicant: SUMITOMO ELECTRIC INDUSTRIES, LTD., Osaka (JP)

(72) Inventors: Takaya Miyase, Osaka (JP); Keiji Wada, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 668 days.

This patent is subject to a terminal disclaimer.

(21) Appl. No.: 17/267,099

(22) PCT Filed: Jun. 3, 2019

(86) PCT No.: PCT/JP2019/021964
§ 371 (c)(1),
(2) Date: Feb. 9, 2021

(87) PCT Pub. No.: WO2020/039684
PCT Pub. Date: Feb. 27, 2020

(65) Prior Publication Data
US 2021/0166941 A1 Jun. 3, 2021

(30) Foreign Application Priority Data
Aug. 21, 2018 (JP) .................................. 2018-154412

(51) Int. Cl.
*H01L 21/02* (2006.01)
*C23C 16/32* (2006.01)
(Continued)

(52) U.S. Cl.
CPC ...... *H01L 21/02529* (2013.01); *C23C 16/325* (2013.01); *C30B 25/20* (2013.01);
(Continued)

(58) Field of Classification Search
CPC ......... H01L 21/02529; H01L 21/02609; H01L 21/0262; H01L 21/02378; H01L 21/02433;
(Continued)

(56) References Cited

U.S. PATENT DOCUMENTS 11,735,415 B2 * 8/2023 Miyase ............ H01L 21/02433
438/478
2014/0264384 A1 9/2014 Loboda et al.
(Continued)

FOREIGN PATENT DOCUMENTS

JP 2005-005617 A 1/2005
JP 2011165948 A 8/2011
(Continued)

OTHER PUBLICATIONS

International Search Report for corresponding Application No. PCT/JP2019/021964, mailed Jul. 23, 2019.
(Continued)

*Primary Examiner* — Su C Kim
(74) *Attorney, Agent, or Firm* — Renner, Otto, Boisselle & Sklar, LLP

(57) ABSTRACT

A first main surface is a (000-1) plane or a plane inclined by an angle of less than or equal to 8° relative to the (000-1) plane. A substrate placement surface has an area of more than or equal to 697 cm² and less than or equal to 1161 cm². When an X axis indicates a first value and a Y axis indicates a second value, the first value and the second value fall within a hexagonal region surrounded by first coordinates, second coordinates, third coordinates, fourth coordinates,
(Continued)

fifth coordinates and sixth coordinates in XY plane coordinates, where the first coordinates are (0.038, 0.0019), the second coordinates are (0.069, 0.0028), the third coordinates are (0.177, 0.0032), the fourth coordinates are (0.038, 0.0573), the fifth coordinates are (0.069, 0.0849), and the sixth coordinates are (0.177, 0.0964).

4 Claims, 18 Drawing Sheets

(51) Int. Cl.
      *C30B 25/20*       (2006.01)
      *C30B 29/36*       (2006.01)

(52) U.S. Cl.
      CPC ........ *C30B 29/36* (2013.01); *H01L 21/02609* (2013.01); *H01L 21/0262* (2013.01)

(58) Field of Classification Search
      CPC ....... H01L 29/12; H01L 29/78; C23C 16/325; C23C 16/455; C30B 25/20; C30B 29/36; C30B 25/165
      See application file for complete search history.

(56) References Cited

U.S. PATENT DOCUMENTS

| | | |
|---|---|---|
| 2014/0287539 A1 | 9/2014 | Ito et al. |
| 2017/0369996 A1 | 12/2017 | Imanaka et al. |
| 2018/0237942 A1 | 8/2018 | Wada |
| 2018/0363166 A1 | 12/2018 | Wada |
| 2020/0013858 A1 | 1/2020 | Itoh |
| 2021/0166941 A1 | 6/2021 | Miyase et al. |

FOREIGN PATENT DOCUMENTS

| | | |
|---|---|---|
| JP | 2017-17084 A | 1/2017 |
| JP | 6090552 B1 | 3/2017 |
| JP | 2017-85169 A | 5/2017 |
| JP | 2017-145150 A | 8/2017 |
| JP | 2017-228708 A | 12/2017 |
| WO | 2017/056691 A1 | 4/2017 |
| WO | 2018/142744 A1 | 8/2018 |

OTHER PUBLICATIONS

International Search Report for corresponding Application No. PCT/JP2019/025829, mailed Aug. 13, 2019.
Office Action for corresponding U.S. Appl. No. 17/267,768, mailed Sep. 28, 2022.
Notice of Allowance for corresponding U.S. Appl. No. 17/267,768, mailed Apr. 10, 2023.

* cited by examiner

US 12,020,927 B2

METHOD FOR MANUFACTURING SILICON CARBIDE EPITAXIAL SUBSTRATE AND METHOD FOR MANUFACTURING SILICON CARBIDE SEMICONDUCTOR DEVICE

TECHNICAL FIELD

The present disclosure relates to a method for manufacturing a silicon carbide epitaxial substrate and a method for manufacturing a silicon carbide semiconductor device. The present application claims priority to Japanese Patent Application No. 2018-154412 filed on Aug. 21, 2018, the entire contents of which are incorporated herein by reference.

BACKGROUND ART

WO 2017/056691 (PTL 1) discloses a method for epitaxially growing a silicon carbide layer on a silicon carbide single-crystal substrate.

CITATION LIST

Patent Literature

PTL 1: WO 2017/056691

SUMMARY OF INVENTION

A method for manufacturing a silicon carbide epitaxial substrate according to the present disclosure includes the following steps. A susceptor having a substrate placement surface, a silicon carbide single-crystal substrate having a first main surface and a second main surface opposite to the first main surface, and a reaction chamber in which the susceptor is disposed are prepared. The silicon carbide single-crystal substrate is placed on the substrate placement surface such that the second main surface faces the substrate placement surface. A silicon carbide layer is formed on the first main surface by supplying a mixed gas including silane, ammonia and hydrogen to the reaction chamber. The first main surface is a (000-1) plane or a plane inclined by an angle of less than or equal to 8° relative to the (000-1) plane. The substrate placement surface has an area of more than or equal to 697 cm$^2$ and less than or equal to 1161 cm$^2$. In the forming of the silicon carbide layer, when an X axis indicates a first value representing, in percentage, a value obtained by dividing a flow rate of the silane by a flow rate of the hydrogen, and a Y axis indicates a second value representing a flow rate of the ammonia in sccm, the first value and the second value fall within a hexagonal region surrounded by first coordinates, second coordinates, third coordinates, fourth coordinates, fifth coordinates and sixth coordinates in XY plane coordinates, where the first coordinates are (0.038, 0.0019), the second coordinates are (0.069, 0.0028), the third coordinates are (0.177, 0.0032), the fourth coordinates are (0.038, 0.0573), the fifth coordinates are (0.069, 0.0849), and the sixth coordinates are (0.177, 0.0964). After the forming of the silicon carbide layer, an average value of carrier concentration in the silicon carbide layer is more than or equal to $1\times10^{15}$ cm$^{-3}$ and less than or equal to $3\times10^{16}$ cm$^{-3}$.

A method for manufacturing a silicon carbide epitaxial substrate according to the present disclosure includes the following steps. A susceptor having a substrate placement surface, a silicon carbide single-crystal substrate having a first main surface and a second main surface opposite to the first main surface, and a reaction chamber in which the susceptor is disposed are prepared. The silicon carbide single-crystal substrate is placed on the substrate placement surface such that the second main surface faces the substrate placement surface. A silicon carbide layer is formed on the first main surface by supplying a mixed gas including silane, ammonia and hydrogen to the reaction chamber. The first main surface is a (000-1) plane or a plane inclined by an angle of less than or equal to 8° relative to the (000-1) plane. The substrate placement surface has an area of more than or equal to 697 cm$^2$ and less than or equal to 1161 cm$^2$. In the forming of the silicon carbide layer, when an X axis indicates a first value representing, in cm$^{-2}$, a value obtained by dividing a value, which is obtained by dividing a flow rate of the silane by a flow rate of the hydrogen, by the area, and a Y axis indicates a second value representing a flow rate of the ammonia in sccm, the first value and the second value fall within a hexagonal region surrounded by first coordinates, second coordinates, third coordinates, fourth coordinates, fifth coordinates and sixth coordinates in XY plane coordinates, where the first coordinates are ($4.10\times10^{-7}$, 0.0019), the second coordinates are ($7.44\times10^{-7}$, 0.0028), the third coordinates are ($1.91\times10^{-6}$, 0.0032), the fourth coordinates are ($4.10\times10^{-7}$, 0.0573), the fifth coordinates are ($7.44\times10^{-7}$, 0.0849), and the sixth coordinates are ($1.91\times10^{-6}$, 0.0964). After the forming of the silicon carbide layer, an average value of carrier concentration in the silicon carbide layer is more than or equal to $1\times10^{15}$ cm$^{-3}$ and less than or equal to $3\times10^{16}$ cm$^{-3}$.

DETAILED DESCRIPTION

Figure 1:
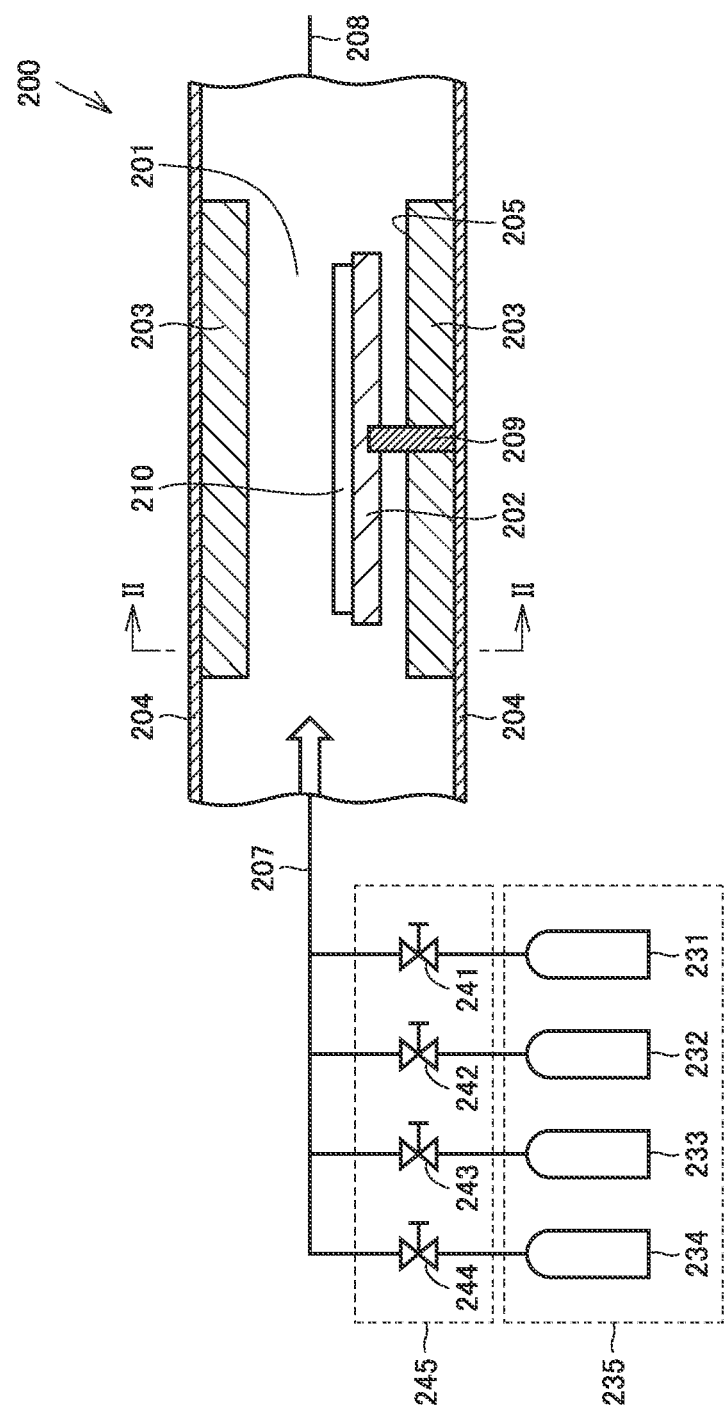
FIG. 1 is a partial schematic cross-sectional view showing a configuration of a manufacturing apparatus for a silicon carbide epitaxial substrate according to a first embodiment.

Problems to be Solved by the Present Disclosure

An object of the present disclosure is to achieve rapid growth of a silicon carbide layer, while improving the flatness of a surface of the silicon carbide layer and in-plane uniformity of carrier concentration.

Effects of the Present Disclosure

According to the present disclosure, rapid growth of a silicon carbide layer can be achieved while the flatness of a surface of the silicon carbide layer and in-plane uniformity of carrier concentration are improved.

Overview of Embodiments of the Present Disclosure

An overview of embodiments of the present disclosure is described first. Regarding crystallographic denotation herein, an individual orientation is represented by [ ], a group orientation is represented by < >, an individual plane is represented by ( ), and a group plane is represented by { }. A crystallographically negative index is normally expressed by putting "-" (bar) above a numeral, however, the crystallographically negative index is expressed herein by putting a negative sign before the numeral.

(1) A method for manufacturing a silicon carbide epitaxial substrate 100 according to the present disclosure includes the following steps. A susceptor 210 having a substrate placement surface 211, a silicon carbide single-crystal substrate 10 having a first main surface 41 and a second main surface 42 opposite to first main surface 41, and a reaction chamber in which susceptor 210 is disposed are prepared. Silicon carbide single-crystal substrate 10 is placed on substrate placement surface 211 such that second main surface 42 faces the substrate placement surface. A silicon carbide layer 20 is formed on first main surface 41 by supplying a mixed gas including silane, ammonia and hydrogen to reaction chamber 201. First main surface 41 is a (000-1) plane or a plane inclined by an angle of less than or equal to 8° relative to the (000-1) plane. Substrate placement surface 211 has an area of more than or equal to 697 cm$^2$ and less than or equal to 1161 cm$^2$. In the forming of silicon carbide layer 20, when an X axis indicates a first value representing, in percentage, a value obtained by dividing a flow rate of the silane by a flow rate of the hydrogen, and a Y axis indicates a second value representing a flow rate of the ammonia in sccm, the first value and the second value fall within a hexagonal region surrounded by first coordinates, second coordinates, third coordinates, fourth coordinates, fifth coordinates and sixth coordinates in XY plane coordinates, where the first coordinates are (0.038, 0.0019), the second coordinates are (0.069, 0.0028), the third coordinates are (0.177, 0.0032), the fourth coordinates are (0.038, 0.0573), the fifth coordinates are (0.069, 0.0849), and the sixth coordinates are (0.177, 0.0964). After the forming of silicon carbide layer 20, an average value of carrier concentration in silicon carbide layer 20 is more than or equal to $1\times10^{15}$ cm$^{-3}$ and less than or equal to $3\times10^{16}$ cm$^{-3}$. Note that the unit "sccm (standard cc/minute)" of the flow rate indicates a flow rate "cc/minute" under standard conditions (0° C., 101.3 kPa).

(2) A method for manufacturing a silicon carbide epitaxial substrate 100 according to the present disclosure includes the following steps. A susceptor 210 having a substrate placement surface 211, a silicon carbide single-crystal substrate 10 having a first main surface 41 and a second main surface 42 opposite to first main surface 41, and a reaction chamber 201 in which susceptor 210 is disposed are prepared. Silicon carbide single-crystal substrate 10 is placed on substrate placement surface 211 such that second main surface 42 faces the substrate placement surface. A silicon carbide layer 20 is formed on first main surface 41 by supplying a mixed gas including silane, ammonia and hydrogen to reaction chamber 201. First main surface 41 is a (000-1) plane or a plane inclined by an angle of less than or equal to 8° relative to the (000-1) plane. Substrate placement surface 211 has an area of more than or equal to 697 cm$^2$ and less than or equal to 1161 cm$^2$. In the forming of silicon carbide layer 20, when an X axis indicates a first value representing, in cm$^{-2}$, a value obtained by dividing a value, which is obtained by dividing a flow rate of the silane by a flow rate of the hydrogen, by the area, and a Y axis indicates a second value representing a flow rate of the ammonia in sccm, the first value and the second value fall within a hexagonal region surrounded by first coordinates, second coordinates, third coordinates, fourth coordinates, fifth coordinates and sixth coordinates in XY plane coordinates, where the first coordinates are ($4.10\times10^{-7}$, 0.0019), the second coordinates are ($7.44\times10^{-7}$, 0.0028), the third coordinates are ($1.91\times10^{-6}$, 0.0032), the fourth coordinates are ($4.10\times10^{-7}$, 0.0573), the fifth coordinates are ($7.44\times10^{-7}$, 0.0849), and the sixth coordinates are ($1.91\times10^{-6}$, 0.0964). After the forming of silicon carbide layer 20, an average value of carrier concentration in silicon carbide layer 20 is more than or equal to $1\times10^{15}$ cm$^{-3}$ and less than or equal to $3\times10^{16}$ cm$^{-3}$.

(3) A method for manufacturing a silicon carbide semiconductor device according to the present disclosure includes the following steps. Silicon carbide epitaxial substrate 100 manufactured with the method according to (1) or (2) is prepared. The silicon carbide epitaxial substrate is processed.

Details of Embodiments of the Present Disclosure

The following describes one embodiment (hereinafter also referred to as "the present embodiment") of the present disclosure. However, the present embodiment is not limited as such. In the following description, the same or corresponding elements are designated by the same characters and the same description thereof will not be repeated.

First Embodiment

A configuration of a manufacturing apparatus 200 for a silicon carbide epitaxial substrate 100 according to a first embodiment is initially described.

As shown in FIG. 1, manufacturing apparatus 200 is a hot wall type lateral CVD (Chemical Vapor Deposition) apparatus, for example. Manufacturing apparatus 200 mainly includes a reaction chamber 201, a gas supplier 235, a controller 245, a heating element 203, a quartz tube 204, a heat insulator (not shown), and an induction heating coil (not shown).

Heating element 203 has a cylindrical shape, for example, and forms reaction chamber 201 inside. Healing element 203 is made of graphite, for example. The heat insulator surrounds an outer circumference of heating element 203. The heat insulator is provided inside quartz tube 204 in contact with an inner circumferential surface of quartz tube 204. The induction heating coil is wound along an outer circumferential surface of quartz tube 204, for example. The induction heating coil is configured to receive alternating current by an external power supply (not shown). Heating element 203 is thus inductively heated. As a result, reaction chamber 201 is heated by heating element 203.

Reaction chamber 201 is a space formed by being surrounded by an inner wall surface 205 of heating element 203. In reaction chamber 201, a silicon carbide single-crystal substrate 10 is disposed. Reaction chamber 201 is configured to heat silicon carbide single-crystal substrate 10. Silicon carbide single-crystal substrate 10 has a maximum diameter of more than or equal to 100 mm. Reaction chamber 201 is provided with a susceptor 210 that holds silicon carbide single-crystal substrate 10. Susceptor 210 is disposed on a stage 202. Stage 202 is configured to rotate by a rotation shaft 209. Rotation of stage 202 allows rotation of susceptor 210.

Manufacturing apparatus 200 further includes a gas inlet 207 and a gas outlet 208. Gas outlet 208 is connected to an exhaust pump (not shown). An arrow in FIG. 1 indicates a flow of gas. Gas is introduced through gas inlet 207 into reaction chamber 201, and exhausted through gas outlet 208. A pressure in reaction chamber 201 is adjusted in accordance with a balance between an amount of the supplied gas and an amount of the exhausted gas.

Gas supplier 235 is configured to supply a mixed gas including silane, ammonia, and gas including hydrogen and carbon atoms to reaction chamber 201. Specifically, gas supplier 235 may include a first gas supplier 231, a second gas supplier 232, a third gas supplier 233, and a carrier gas supplier 234.

First gas supplier 231 is configured to supply a first gas including carbon atoms. First gas supplier 231 is a gas cylinder filled with the first gas, for example. The first gas is propane ($C_3H_8$) gas, for example. The first gas may be methane ($CH_4$) gas, ethane ($C_2H_6$) gas, acetylene ($C_2H_2$) gas, or the like, for example.

Second gas supplier 232 is configured to supply a second gas including silane gas. Second gas supplier 232 is a gas cylinder filled with the second gas, for example. The second gas is silane ($SiH_4$) gas, for example. The second gas may be a mixed gas of silane gas and gas other than silane.

Third gas supplier 233 is configured to supply a third gas including ammonia gas. Third gas supplier 233 is a gas cylinder filled with the third gas, for example. The third gas is a doping gas including N (nitrogen atoms). The ammonia gas is more likely to be thermally decomposed than nitrogen gas having a triple bond. By using the ammonia gas, in-plane uniformity of carder concentration can be expected to be improved.

Carrier gas supplier 234 is configured to supply a carrier gas such as hydrogen. Carrier gas supplier 234 is a gas cylinder filled with hydrogen, for example.

Controller 245 is configured to control a flow rate of the mixed gas supplied from gas supplier 235 to reaction chamber 201. Specifically, controller 245 may include a first gas flow rate controller 241, a second gas flow rate controller 242, a third gas flow rate controller 243, and a carder gas flow rate controller 244. Each of the controllers may be a MFC (Mass Flow Controller), for example. Controller 245 is disposed between gas supplier 235 and gas inlet 207. In other words, controller 245 is disposed in a flow path that connects between gas supplier 235 and gas inlet 207.

In the axial direction of reaction chamber 201, a density of windings of the induction heating coil may be changed. The density of windings [the number of windings/m] is the number of windings of the coil per unit length in the axial direction of the apparatus. For example, in order to thermally decompose ammonia effectively at the upstream side, the density of windings of the induction heating coil at the upstream side may be higher than the density of windings of the induction heating coil at the downstream side.

Figure 2:
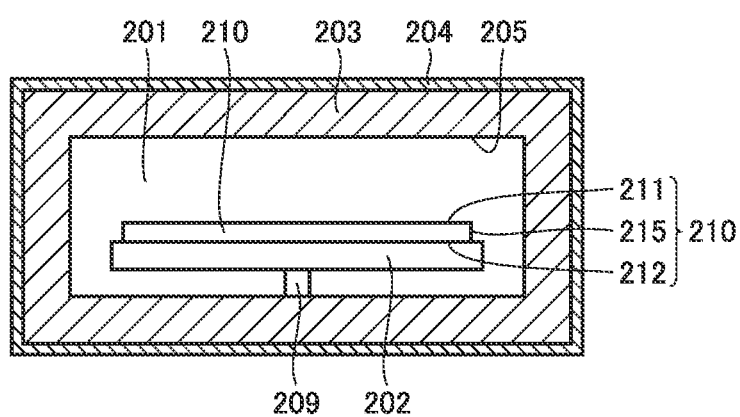
FIG. 2 is a schematic cross-sectional view along line II-II in FIG. 1.

FIG. 2 is a schematic cross-sectional view along line II-II in FIG. 1. As shown in FIG. 2, a region surrounded by inner wall surface 205 of heating element 203 is substantially rectangular in shape, for example. A width of the region surrounded by inner wall surface 205 of heating element 203 in a direction along the radial direction of silicon carbide single-crystal substrate 10 may be smaller than a width of the region surrounded by inner wall surface 205 of heating element 203 in a direction perpendicular to the radial direction of silicon carbide single-crystal substrate 10. Manufacturing apparatus 200 for silicon carbide epitaxial substrate 100 according to the present embodiment has large reaction chamber 201. Specifically, reaction chamber 201 has a cross-sectional area of 176 cm$^2$, for example, in a plane perpendicular to the direction of movement of the mixed gas. The cross-sectional area of reaction chamber 201 may be more than or equal to 132 cm$^2$, or more than or equal to 150 cm$^2$. The cross-sectional area of reaction chamber 201 may be less than or equal to 220 cm$^2$, or less than or equal to 200 cm$^2$. Note that the cross-sectional area of reaction chamber 201 is the area of the region surrounded by inner wall surface 205 of heating element 203 (see FIG. 2).

Figure 3:
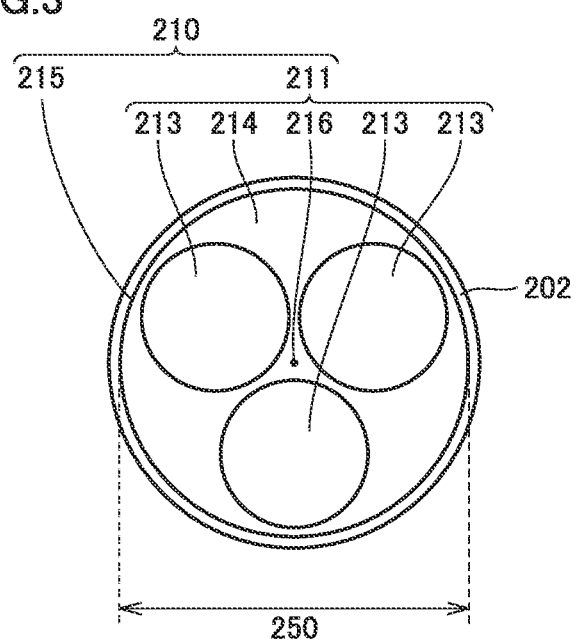
FIG. 3 is a schematic plan view showing a configuration of a susceptor in the manufacturing apparatus for the silicon carbide epitaxial substrate according to the first embodiment.

As shown in FIG. 3, susceptor 210 can have a plurality of substrates disposed thereon. From a different viewpoint, susceptor 210 is of batch type. Susceptor 210 has a substrate placement surface 211, a bottom surface 212, and a side surface 215. Substrate placement surface 211 is a surface on which the substrates are placed. Bottom surface 212 is a surface opposite to substrate placement surface 211. Bottom surface 212 is a surface mounted on stage 202. Side surface 215 is continuous to each of substrate placement surface 211 and bottom surface 212. Substrate placement surface 211 has a plurality of substrate placement portions 213, a top surface 214, and a center 216. As seen in a direction perpendicular to top surface 214, center 216 is disposed at a position coinciding with rotation shaft 209. Each of the plurality of substrate placement portions 213 is a recess. Silicon carbide single-crystal substrate 10 is disposed in each of the plurality of substrate placement portions 213. There are three substrate placement portions 213, for example. The plurality of substrate placement portions 213 are rotationally symmetrically positioned with respect to center 216. Specifically, substrate placement portions 213 are positioned at 0°, 120° and 240°, as seen from center 216. As seen in the direction perpendicular to top surface 214, each of the plurality of substrate placement portions 213 is substantially circular in shape.

Manufacturing apparatus 200 for silicon carbide epitaxial substrate 100 according to the present embodiment has large susceptor 210. Specifically, substrate placement surface 211 of susceptor 210 has an area of 929 cm$^2$, for example. In this case, one-half (radius) of a diameter 250 of substrate placement surface 211 is 17.2 cm, for example. The area of substrate placement surface 211 of susceptor 210 may be more than or equal to 697 cm$^2$, or more than or equal to 750 cm$^2$, for example. The area of substrate placement surface 211 of susceptor 210 may be less than or equal to 1161 cm$^2$, or less than or equal to 950 cm$^2$.

Next, a method for manufacturing the silicon carbide epitaxial substrate according to the present embodiment is described.

Figure 4:
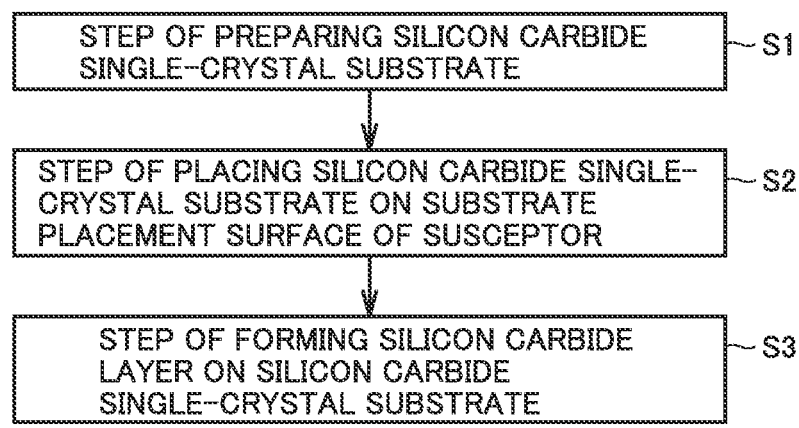
FIG. 4 is a flowchart schematically showing a method for manufacturing the silicon carbide epitaxial substrate according to the present embodiment.

First, a step of preparing silicon carbide single-crystal substrate 10 (S1: FIG. 4) is performed. A silicon carbide single crystal having a polytype of 4H is fabricated by sublimation, for example. Then, the silicon carbide single crystal is sliced by a wire saw, for example, whereby silicon carbide single-crystal substrate 10 is prepared (see FIG. 4). Silicon carbide single-crystal substrate 10 has a first main surface 41 and a second main surface 42. Second main surface 42 is a surface opposite to first main surface 41. The silicon carbide single crystal has a polytype of 4H—SiC, for example. The 4H—SiC has better electron mobility, dielectric strength, and the like than other polytypes. Silicon carbide single-crystal substrate 10 includes an n type impurity such as nitrogen. The conductivity type of silicon carbide single-crystal substrate 10 is n type, for example.

First main surface 41 is a (000-1) plane or a plane inclined by an angle of less than or equal to 8° relative to the (000-1) plane. When first main surface 41 is inclined relative to the (000-1) plane, the inclination direction (off direction) is a <11-20> direction, for example. The inclination angle (off angle) relative to the (000-1) plane may be more than or equal to 1°, or more than or equal to 2°. The off angle may be less than or equal to 7°, less than or equal to 6°, or less than or equal to 4°. Second main surface 42 is a (0001) plane or a plane inclined by an angle of less than or equal to 8° relative to the (0001) plane.

First main surface 41 of silicon carbide single-crystal substrate 10 has a maximum diameter (diameter) of more than or equal to 100 mm. The diameter may be more than or equal to 150 mm, more than or equal to 200 mm, or more than or equal to 250 mm. Although the upper limit of the diameter is not particularly limited, the upper limit of the diameter may be 300 mm, for example.

Next, a step of placing the silicon carbide single-crystal substrate on a substrate placement surface of a susceptor (S2: FIG. 4) is performed. Specifically, susceptor 210 shown in FIG. 3 is prepared. Silicon carbide single-crystal substrate 10 is disposed in substrate placement portion 213 of susceptor 210. As shown in FIG. 3, when susceptor 210 has three substrate placement portions 213, three silicon carbide single-crystal substrates 10 are disposed in these substrate placement portions 213, respectively.

Figure 5:
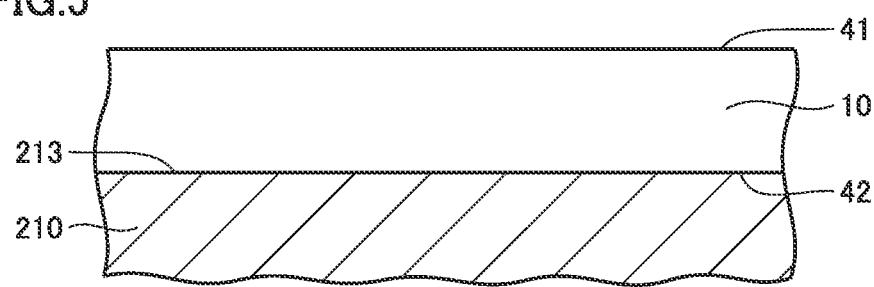
FIG. 5 is a schematic cross-sectional view showing a first step of the method for manufacturing the silicon carbide epitaxial substrate according to the present embodiment.

As shown in FIG. 5, silicon carbide single-crystal substrate 10 is placed on substrate placement surface 211 such that second main surface 42 of silicon carbide single-crystal substrate 10 is in contact with substrate placement portion 213 of susceptor 210. Susceptor 210 with silicon carbide single-crystal substrate 10 placed on substrate placement surface 211 is disposed in reaction chamber 201. Silicon carbide single-crystal substrate 10 may be placed on substrate placement surface 211 inside reaction chamber 201, or may be placed on substrate placement surface 211 outside reaction chamber 201 and then disposed in reaction chamber 201.

Next, a step of forming a silicon carbide layer on the silicon carbide single-crystal substrate (S3: FIG. 4) is performed. Specifically, manufacturing apparatus 200 described above is used to form a silicon carbide layer 20 on silicon carbide single-crystal substrate 10 by epitaxial growth. For example, after the pressure in reaction chamber 201 is reduced from atmospheric pressure to about $1 \times 10^{-6}$ Pa, the temperature of silicon carbide single-crystal substrate 10 is started to be increased. During the temperature increase, hydrogen ($H_2$) gas serving as the carrier gas is introduced from carrier gas supplier 234 into reaction chamber 201. A flow rate of the hydrogen gas is adjusted by carrier gas flow rate controller 244.

After the temperature of silicon carbide single-crystal substrate 10 reaches, for example, about 1600° C., source material gas, dopant gas and carrier gas are supplied to reaction chamber 201. Specifically, a mixed gas including silane, ammonia, hydrogen and propane is supplied to reaction chamber 201, whereby the gases are thermally decomposed to form silicon carbide layer 20 on silicon carbide single-crystal substrate 10. A C/Si ratio of the mixed gas may be 1.0, for example.

Figure 6:
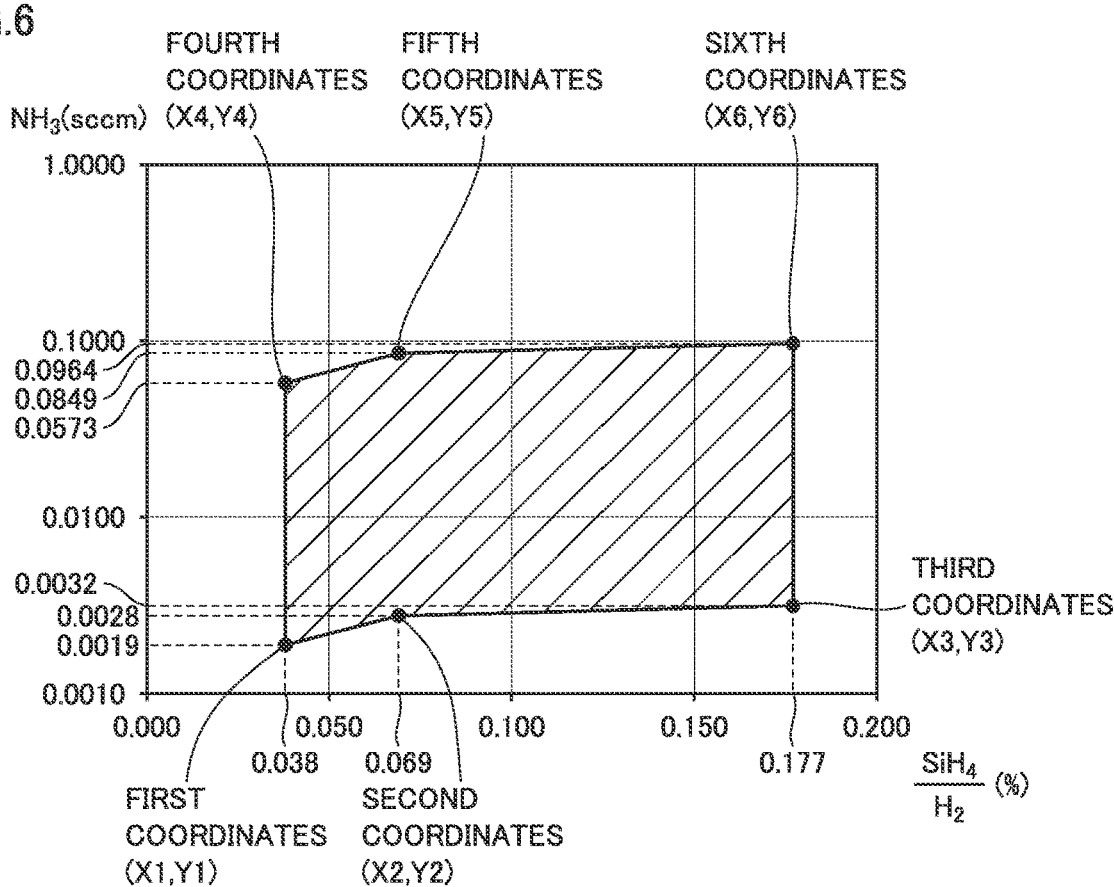
FIG. 6 shows a relation between a SiH$_4$ flow rate/H$_2$ flow rate and a NH$_3$ flow rate in the method for manufacturing the silicon carbide epitaxial substrate according to the present embodiment.

As shown in FIG. 6, the X axis indicates a value (first value) representing, in percentage, a value obtained by dividing a flow rate of the silane by a flow rate of the hydrogen, whereas the Y axis indicates a value (second value) representing a flow rate of the ammonia in sccm. The first value and the second value fall within a hexagonal region (hatched region in FIG. 6) surrounded by first coordinates, second coordinates, third coordinates, fourth coordinates, fifth coordinates and sixth coordinates in XY plane coordinates. The first coordinates are (0.038, 0.0019), the second coordinates are (0.069, 0.0028), the third coordinates are (0.177, 0.0032), the fourth coordinates are (0.038, 0.0573), the fifth coordinates are (0.069, 0.0849), and the sixth coordinates are (0.177, 0.0964).

For example, the flow rate of the carrier gas (hydrogen) supplied to reaction chamber 201 is adjusted to be 100 slm using carrier gas flow rate controller 244. The flow rate of the second gas (silane gas) supplied to reaction chamber 201 is adjusted to be 104 sccm using second gas flow rate controller 242. In this case, the value representing, in percentage, the value obtained by dividing the flow rate of the silane by the flow rate of the hydrogen is 0.038%. The flow rate of the third gas (ammonia gas) is adjusted to be 0.0019 sccm using third gas flow rate controller 243. In this case, the value (first value) representing, in percentage, the value obtained by dividing the flow rate of the silane by the flow rate of the hydrogen and the value (second value) representing the flow rate of the ammonia in sccm fall within the hatched region in FIG. 6.

Figure 7:
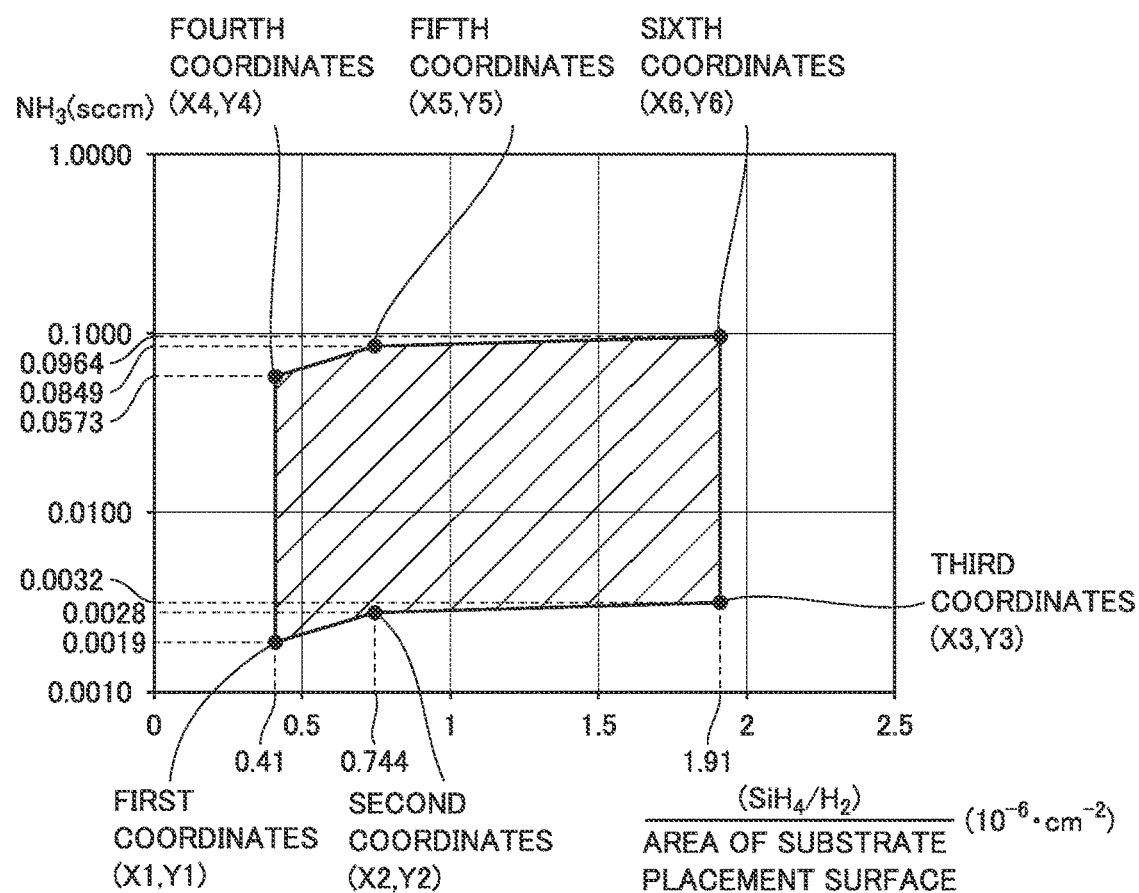
FIG. 7 shows a relation between a value obtained by dividing the (SiH$_4$ flow rate/H$_2$ flow rate) by an area of a substrate placement surface and the NH$_3$ flow rate in the method for manufacturing the silicon carbide epitaxial substrate according to the present embodiment.

As described above, the method for manufacturing the silicon carbide epitaxial substrate according to the present embodiment uses large susceptor 210. Considering the area of substrate placement surface 211 of susceptor 210, the flow rate of the silane, the flow rate of the hydrogen, and the flow rate of the ammonia are controlled as follows. Specifically, as shown in FIG. 7, when the X axis indicates a value (first value) representing, in $cm^{-2}$, a value obtained by dividing the value, which is obtained by dividing the flow rate of the silane by the flow rate of the hydrogen, by the area of substrate placement surface 211, and the Y axis indicates a value (second value) representing the flow rate of the ammonia in sccm, the first value and the second value fall within a hexagonal region (hatched region in FIG. 7) surrounded by first coordinates, second coordinates, third coordinates, fourth coordinates, fifth coordinates and sixth coordinates in XY plane coordinates. The first coordinates are $(4.10 \times 10^{-7}, 0.0019)$, the second coordinates are $(7.44 \times 10^{-7}, 0.0028)$, the third coordinates are $(1.91 \times 10^{-6}, 0.0032)$, the fourth coordinates are $(4.10 \times 10^{-7}, 0.0573)$, the fifth coordinates are $(7.44 \times 10^{-7}, 0.0849)$, and the sixth coordinates are $(1.91 \times 10^{-6}, 0.0964)$.

For example, the flow rate of the carrier gas (hydrogen) supplied to reaction chamber 201 is adjusted to be 100 slm using carrier gas flow rate controller 244. The flow rate of the second gas (silane gas) supplied to reaction chamber 201 is adjusted to be 38 sccm using second gas flow rate controller 242. Substrate placement surface 211 has an area of 929 $cm^2$, for example. In this case, the value (first value) representing, in $cm^{-2}$, the value obtained by dividing the value, which is obtained by dividing the flow rate of the silane by the flow rate of the hydrogen, by the area of substrate placement surface 211 is $4.10 \times 10^{-7}$. The flow rate of the third gas (ammonia gas) is adjusted to be 0.0019 sccm using third gas flow rate controller 243. In this case, the value (first value) representing, in $cm^{-2}$, the value obtained by dividing the value, which is obtained by dividing the flow rate of the silane by the flow rate of the hydrogen, by the area of substrate placement surface 211, and the value (second value) representing the flow rate of the ammonia in sccm fall within the hatched region in FIG. 7.

The flow rate (sccm) of the ammonia may be more than or equal to 0.0019, more than or equal to 0.0028, or more than or equal to 0.0032. The flow rate (sccm) of the ammonia may be, for example, less than or equal to 0.0964, less than or equal to 0.0849, or less than or equal to 0.0573. The value (%) representing, in percentage, the value obtained by dividing the flow rate of the silane by the flow rate of the hydrogen may be more than or equal to 0.038, or more than or equal to 0.069. The value (%) representing, in percentage, the value obtained by dividing the flow rate of the silane by the flow rate of the hydrogen may be less than or equal to 0.177, for example. The flow rate of the silane is more than or equal to 20 sccm and less than or equal to 300 sccm, for example. The flow rate of the hydrogen is more than or equal to 80 slm and less than or equal to 150 slm, for example.

The growth rate of silicon carbide layer 20 may be more than or equal to 3 μm/h, more than or equal to 15 μm/h, more than or equal to 25 μm/h, or more than or equal to 33 μm/h. The growth rate of silicon carbide layer 20 may be less than or equal to 50 μm/h. The growth rate of silicon carbide layer 20 may be determined by a ratio of the flow rate of the hydrogen to the flow rate of the silane. Since the silane is a source material gas, the growth rate of silicon carbide layer 20 increases with an increase in the flow rate of the silane. On the other hand, since the hydrogen has a characteristic to etch silicon carbide, the growth rate of silicon carbide layer 20 decreases with an increase in the flow rate of the hydrogen. In the present embodiment, silicon carbide layer 20 can be grown rapidly. Specifically, the value representing, in percentage, the value obtained by dividing the flow rate of the silane by the flow rate of the hydrogen is more than or equal to 0.038%.

Figure 8:
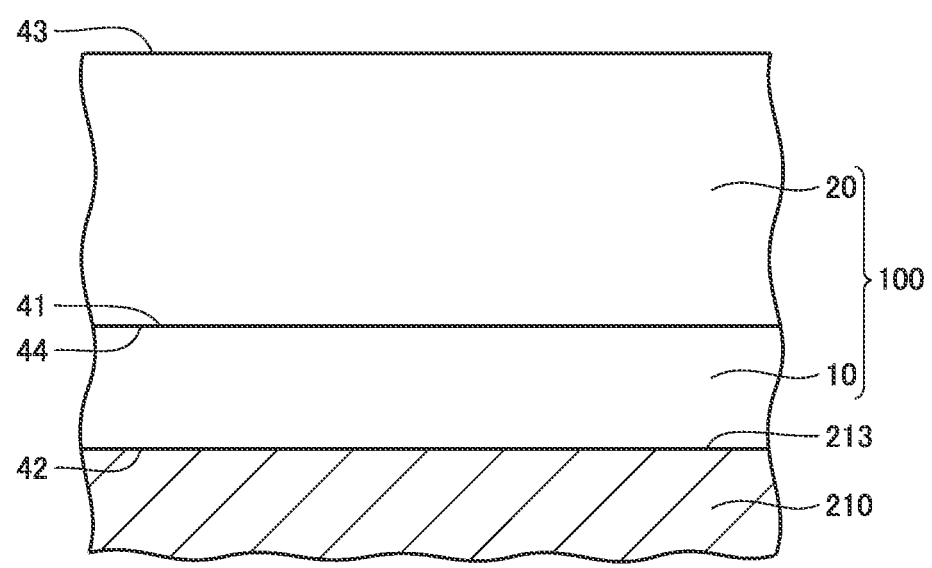
FIG. 8 is a schematic cross-sectional view showing a second step of the method for manufacturing the silicon carbide epitaxial substrate according to the present embodiment.

As described above, the mixed gas of silane, propane, ammonia and hydrogen is supplied to reaction chamber 201, whereby silicon carbide layer 20 is formed on silicon carbide single-crystal substrate 10. Silicon carbide layer 20 has a thickness of more than or equal to 10 μm, for example. Note that methane ($CH_4$), ethane ($C_2H_6$), acetylene ($C_2H_2$), or the like may be used instead of propane. During the supply of the mixed gas to reaction chamber 201, silicon carbide single-crystal substrate 10 may be rotated around rotation shaft 209. Silicon carbide epitaxial substrate 100 including silicon carbide single-crystal substrate 10 and silicon carbide layer 20 (see FIG. 8) is manufactured in this manner. Silicon carbide layer 20 has a fourth main surface 44 in contact with silicon carbide single-crystal substrate 10, and a third main surface 43 opposite to fourth main surface 44.

According to silicon carbide epitaxial substrate 100 manufactured with the method described above, in-plane uniformity of carrier concentration in silicon carbide layer 20 can be improved while an average value of the carrier concentration in silicon carbide layer 20 is maintained to fall within a certain concentration range.

Specifically, after the step of forming silicon carbide layer 20, the average value of the carrier concentration in silicon carbide layer 20 is more than or equal to $1 \times 10^{15}$ $cm^{-3}$ and less than or equal to $3 \times 10^{16}$ $cm^{-3}$. The in-plane uniformity of the carrier concentration is less than or equal to 10%, for example. The in-plane uniformity of the carrier concentration is a representation, in percentage, of a value obtained by dividing the standard deviation of the carrier concentration by the average value of the carrier concentration. The carrier concentration may be measured by a mercury probe type C (capacitance)-V (voltage) measuring device, for example. Specifically, one probe is placed on third main surface 43 of silicon carbide layer 20 and another probe is placed on second main surface 42 of silicon carbide single-crystal substrate 10. The one probe has an area of 0.01 $cm^2$, for example. Voltage is applied between the one probe and the other probe, and a capacitance between the one probe and the other probe is measured. When the vertical axis indicates $1/C^2$ (reciprocal of the square of the capacitance) and the horizontal axis indicates V (voltage), the carrier concentration is determined based on the inclination of a straight line of measurement data. A depth of measurement for the carrier concentration is adjusted in accordance with applied voltage. In the present embodiment, the carrier concentration is measured in a region of silicon carbide layer 20 extending by at most about 10 μm from third main surface 43 toward second main surface 42.

When a plurality of silicon carbide epitaxial substrates 100 are simultaneously manufactured in a batch manner, variation in the carrier concentration can be reduced between each of the plurality of silicon carbide epitaxial substrates 100. Specifically, the difference in average value of the carrier concentration is less than or equal to 3%, for example, between each of the plurality of silicon carbide epitaxial substrates 100.

Third main surface 43 has a root-mean-square deviation (Sq) of less than or equal to 0.4 nm, for example. The root-mean-square deviation (Sq) is a parameter obtained by extending root-mean-square roughness (Rq) to three dimensions. The root-mean-square deviation (Sq) can be measured by a white-light interference microscope, for example. A region for which the root-mean-square deviation (Sq) is measured can be a square region having each side of 250 μm.

(First Variation)

Figure 9:
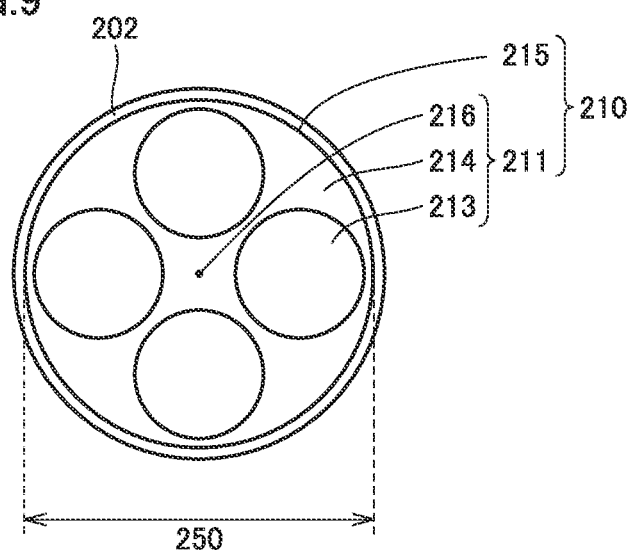
FIG. 9 is a schematic plan view showing a configuration of a susceptor in a manufacturing apparatus for a silicon carbide epitaxial substrate according to a first variation.

As shown in FIG. 9, susceptor 210 may be able to have four silicon carbide single-crystal substrates 10 disposed thereon. From a different viewpoint, substrate placement surface 211 of susceptor 210 has four substrate placement portions 213, top surface 214, and center 216. Four substrate placement portions 213 are rotationally symmetrically positioned with respect to center 216. Specifically, substrate placement portions 213 are positioned at 0°, 90°, 180° and 270°, as seen from center 216.

(Second Variation)

Figure 10:
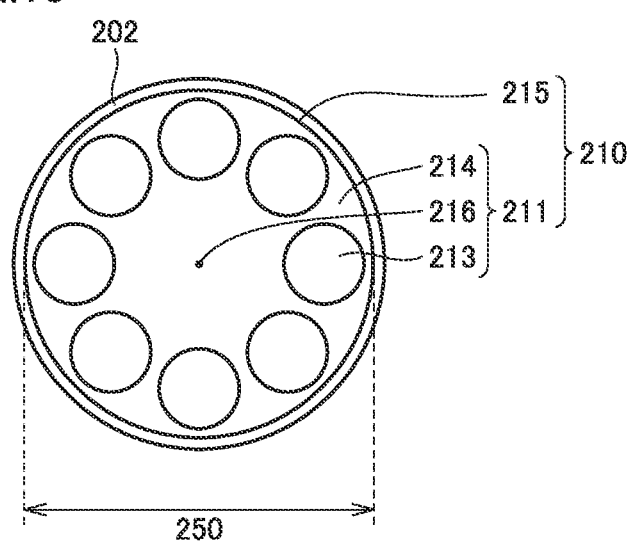
FIG. 10 is a schematic plan view showing a configuration of a susceptor in a manufacturing apparatus for a silicon carbide epitaxial substrate according to a second variation.

As shown in FIG. 10, susceptor 210 may be able to have eight silicon carbide single-crystal substrates 10 disposed thereon. From a different viewpoint, substrate placement surface 211 of susceptor 210 has eight substrate placement portions 213, top surface 214, and center 216. Eight substrate placement portions 213 are rotationally symmetrically positioned with respect to center 216. Specifically, substrate placement portions 213 are positioned at 0°, 45°, 90°, 135°, 180°, 225°, 270° and 315°, as seen from center 216. When eight silicon carbide single-crystal substrates 10 each having a diameter of 150 mm are placed on substrate placement surface 211, diameter 250 of substrate placement surface 211 is 650 mm, for example. In this case, substrate placement surface 211 has an area of 3318 $cm^2$.

Second Embodiment

Next, a configuration of manufacturing apparatus 200 for silicon carbide epitaxial substrate 100 according to a second embodiment is described. Manufacturing apparatus 200 for silicon carbide epitaxial substrate 100 according to the second embodiment is mainly different from manufacturing apparatus 200 for silicon carbide epitaxial substrate 100 according to the first embodiment in the positions of gas inlet 207 and gas outlet 208, and is otherwise similar in configuration to manufacturing apparatus 200 for silicon carbide epitaxial substrate 100 according to the first embodiment. The configuration different from that of manufacturing apparatus 200 for silicon carbide epitaxial substrate 100 according to the first embodiment is principally described below.

Figure 11:
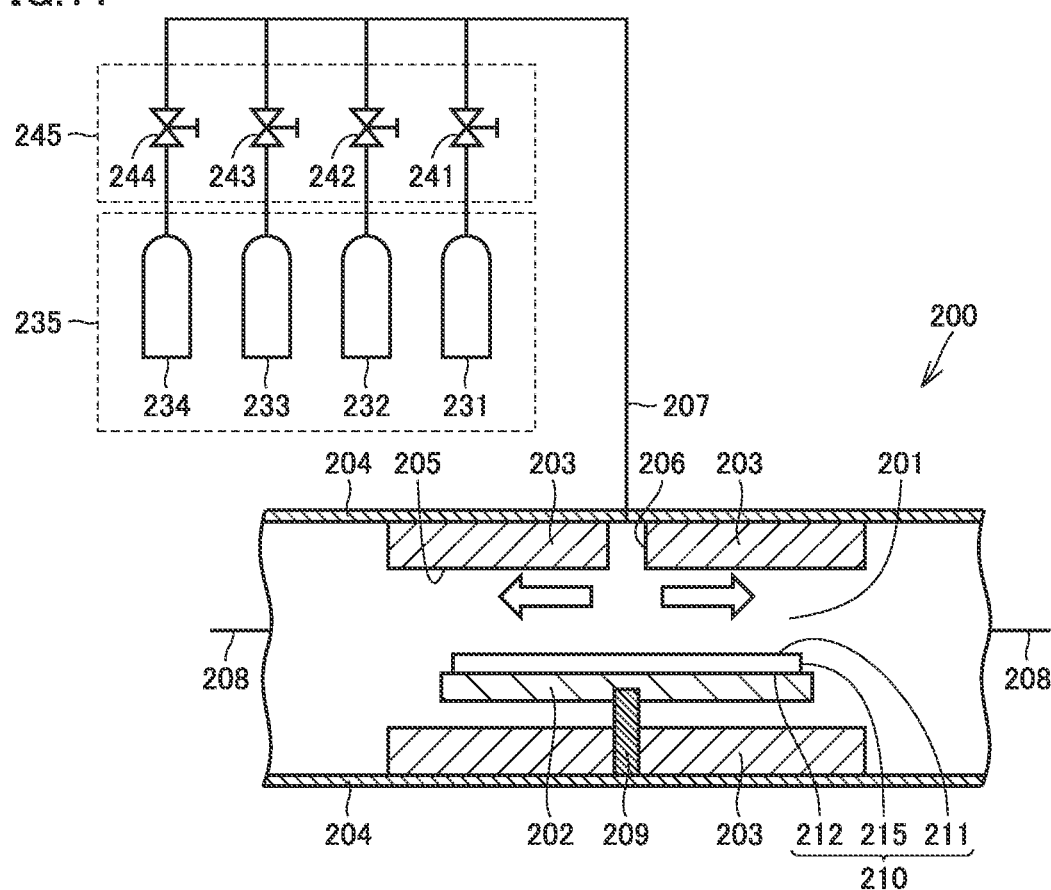
FIG. 11 is a partial schematic cross-sectional view showing a configuration of a manufacturing apparatus for a silicon carbide epitaxial substrate according to a second embodiment.

As shown in FIG. 11, manufacturing apparatus 200 mainly includes reaction chamber 201, gas supplier 235, controller 245, heating element 203, quartz tube 204, the heat insulator (not shown), the induction heating coil (not shown), gas inlet 207, and gas outlets 208.

As shown in FIG. 11, heating element 203 is provided with a gas supply hole 206. Gas inlet 207 is connected to gas supply hole 206. Gas outlets 208 are provided at one end and the other end of quartz tube 204. Gas is introduced through gas supply hole 206 into reaction chamber 201 along the direction perpendicular to first main surface 41 of silicon carbide single-crystal substrate 10. Arrows in FIG. 11 indicate flows of gas. After being introduced into reaction chamber 201, the gas splits to flow toward the one end and the other end of quartz tube 204, and is exhausted through each of gas outlets 208 provided at the opposite sides of quartz tube 204.

Third Embodiment

Next, a configuration of manufacturing apparatus 200 for silicon carbide epitaxial substrate 100 according to a third embodiment is described. Manufacturing apparatus 200 for silicon carbide epitaxial substrate 100 according to the third embodiment is mainly different from manufacturing apparatus 200 for silicon carbide epitaxial substrate 100 according to the first embodiment in being a vertical CVD apparatus, and is otherwise similar in configuration to manufacturing apparatus 200 for silicon carbide epitaxial substrate 100 according to the first embodiment. The configuration different from that of manufacturing apparatus 200 for silicon carbide epitaxial substrate 100 according to the first embodiment is principally described below.

Figure 12:
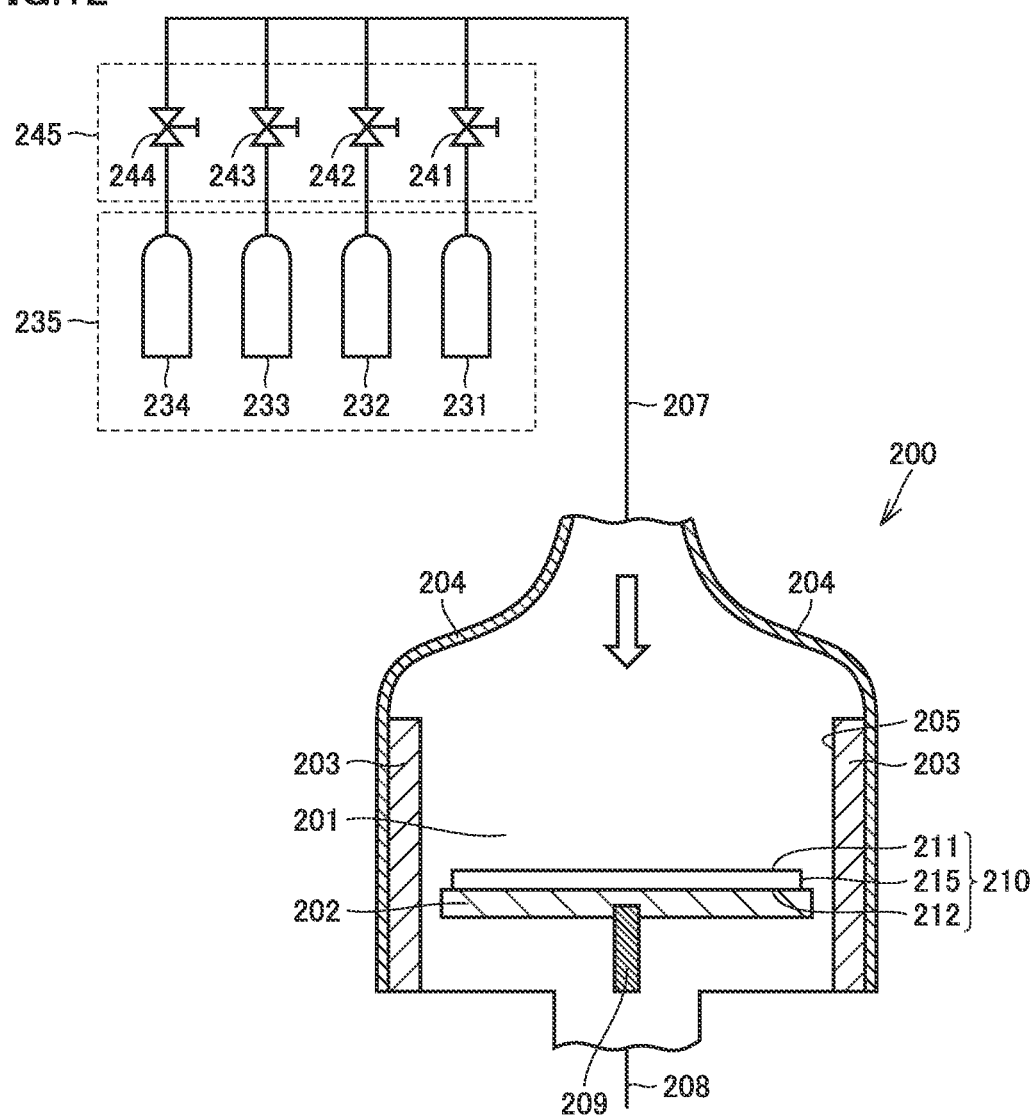
FIG. 12 is a partial schematic cross-sectional view showing a configuration of a manufacturing apparatus for a silicon carbide epitaxial substrate according to a third embodiment.

As shown in FIG. 12, manufacturing apparatus 200 may be a vertical CVD apparatus. Manufacturing apparatus 200 mainly includes reaction chamber 201, gas supplier 235, controller 245, heating element 203, quartz tube 204, the heat insulator (not shown), the induction heating coil (not shown), gas inlet 207, and gas outlet 208.

As shown in FIG. 12, heating element 203 is provided to surround side surface 215 of susceptor 210. Gas inlet 207 is disposed above susceptor 210 in the vertical direction. Gas outlet 208 is disposed below susceptor 210 in the vertical direction. Gas is introduced through gas supply hole 206 into reaction chamber 201 along the direction perpendicular to first main surface 41 of silicon carbide single-crystal substrate 10. An arrow in FIG. 12 indicates a flow of gas. After being introduced into reaction chamber 201, the gas flows toward gas outlet 208 along the direction perpendicular to first main surface 41 of silicon carbide single-crystal substrate 10.

Next, functions and effects of the method for manufacturing silicon carbide epitaxial substrate 100 according to the present embodiment are described.

Silicon carbide epitaxial substrate 100 used to manufacture a silicon carbide semiconductor device is required to achieve excellent in-plane uniformity of carrier concentration and excellent flatness of the surface of silicon carbide layer 20 while maintaining an average carrier concentration to fall within a certain range required in silicon carbide semiconductor devices. In recent years, in addition to achieving the characteristics described above, it has been required to grow silicon carbide layer 20 at a higher rate.

However, if the growth rate of silicon carbide layer 20 is simply increased, the flatness of the surface of silicon carbide layer 20 may be deteriorated. Moreover, for maintaining the excellent flatness of the surface of silicon carbide layer 20, the average carrier concentration in silicon carbide layer 20 may fall out of the range required in power devices. In other words, it has been very difficult to achieve the rapid growth of silicon carbide layer 20, the excellent flatness of the surface of silicon carbide layer 20, and the excellent in-plane uniformity of the carrier concentration, while maintaining the average carrier concentration in silicon carbide layer 20 to fall within the certain range required in silicon carbide semiconductor devices.

If silicon carbide epitaxial substrate 100 is manufactured, using large manufacturing apparatus 200, under the same conditions as those for conventional small manufacturing devices, it may not be possible to achieve the excellent in-plane uniformity of the carrier concentration and the excellent flatness of the surface of silicon carbide layer 20, while maintaining the average carrier concentration to fall within the certain range required in silicon carbide semiconductor devices. Note that large manufacturing apparatus 200 refers to, for example, manufacturing apparatus 200 having reaction chamber 201 capable of accommodating susceptor 210 having substrate placement surface 211 with an area of more than or equal to 697 cm$^2$.

The present inventors conducted extensive research on a method for manufacturing silicon carbide epitaxial substrate 100 satisfying the above-described requirements using large manufacturing apparatus 200. Consequently, they made the following findings and conceived of one embodiment of the present disclosure. Specifically, it was found that silicon carbide epitaxial substrate 100 satisfying the above-described requirements can be realized by using silane as a source material gas, using hydrogen as a carrier gas, and using ammonia as a dopant gas, and controlling a silane flow rate, a hydrogen flow rate and an ammonia flow rate to fall within a certain range. Specifically, when the X axis indicates a first value representing, in percentage, a value obtained by dividing the flow rate of the silane by the flow rate of the hydrogen, and the Y axis indicates a second value representing the flow rate of the ammonia in sccm, the flow rate of the silane, the flow rate of the hydrogen, and the flow rate of the ammonia are controlled such that the first value and the second value fall within a hexagonal region surrounded by first coordinates, second coordinates, third coordinates, fourth coordinates, fifth coordinates and sixth coordinates in XY plane coordinates. In this case, the first coordinates are (0.038, 0.0019), the second coordinates are (0.069, 0.0028), the third coordinates are (0.177, 0.0032), the fourth coordinates are (0.038, 0.0573), the fifth coordinates are (0.069, 0.0849), and the sixth coordinates are (0.177, 0.0964).

From a different viewpoint, when the X axis indicates a first value representing, in cm$^{-2}$, a value obtained by dividing the value, which is obtained by dividing the flow rate of the silane by the flow rate of the hydrogen, by the area of substrate placement surface 211, and the Y axis indicates a second value representing the flow rate of the ammonia in sccm, the flow rate of the silane, the flow rate of the hydrogen, and the flow rate of the ammonia are controlled such that the first value and the second value fall within a hexagonal region surrounded by first coordinates, second coordinates, third coordinates, fourth coordinates, fifth coordinates and sixth coordinates in XY plane coordinates. In this case, the first coordinates are ($4.10 \times 10^{-7}$, 0.0019), the second coordinates are ($7.44 \times 10^{-7}$, 0.0028), the third coordinates are ($1.91 \times 10^{-6}$, 0.0032), the fourth coordinates are ($4.10 \times 10^{-7}$, 0.0573), the fifth coordinates are ($7.44 \times 10^{-7}$, 0.0849), and the sixth coordinates are ($1.91 \times 10^{-6}$, 0.0964).

By controlling the flow rate of the silane, the flow rate of the hydrogen, and the flow rate of the ammonia as described above, when large manufacturing apparatus 200 is used, the rapid growth of silicon carbide layer 20 can be achieved while the flatness of the surface of silicon carbide layer 20 and the in-plane uniformity of the carrier concentration are improved. In addition, when silicon carbide layers 20 are simultaneously grown on a plurality of silicon carbide single-crystal substrates 10 (from a different viewpoint, when batch processing is performed), variation in the in-plane uniformity of the carrier concentration between each of the plurality of silicon carbide epitaxial substrates 100 can be reduced.

(Method for Manufacturing Silicon Carbide Semiconductor Device)

Next, a method for manufacturing a silicon carbide semiconductor device 300 according to the present embodiment is described.

Figure 13:
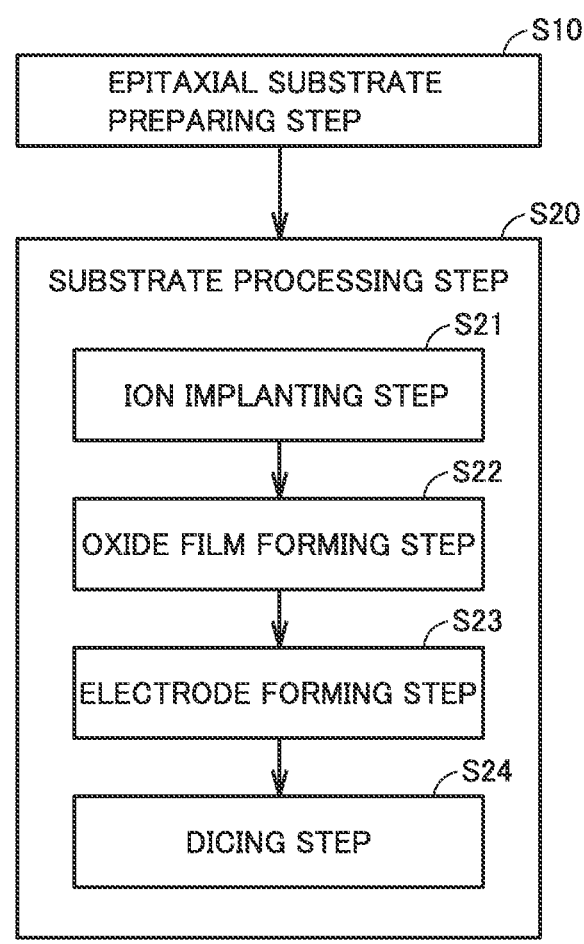
FIG. 13 is a flowchart schematically showing a method for manufacturing a silicon carbide semiconductor device according to the present embodiment.

The method for manufacturing the silicon carbide semiconductor device according to the present embodiment mainly includes an epitaxial substrate preparing step (S10: FIG. 13) and a substrate processing step (S20: FIG. 13).

First, the epitaxial substrate preparing step (S10: FIG. 13) is performed. Specifically, silicon carbide epitaxial substrate 100 is prepared with the above-described method for manufacturing silicon carbide epitaxial substrate 100 (see FIG. 8).

Next, the substrate processing step (S20: FIG. 13) is performed. Specifically, silicon carbide epitaxial substrate 100 is processed to manufacture the silicon carbide semiconductor device. The term "process" herein includes various types of processes such as ion implantation, heat treatment, etching, oxide film formation, electrode formation, and dicing. That is, the substrate processing step may include at least one process from the ion implantation, heat treatment, etching, oxide film formation, electrode formation, and dicing.

The following describes a method for manufacturing a MOSFET (Metal Oxide Semiconductor Field Effect Transistor) as an exemplary silicon carbide semiconductor device. The substrate processing step (S20: FIG. 13) includes an ion implanting step (S21: FIG. 13), an oxide film forming step (S22: FIG. 13), an electrode forming step (S23: FIG. 13), and a dicing step (S24: FIG. 13).

Figure 14:
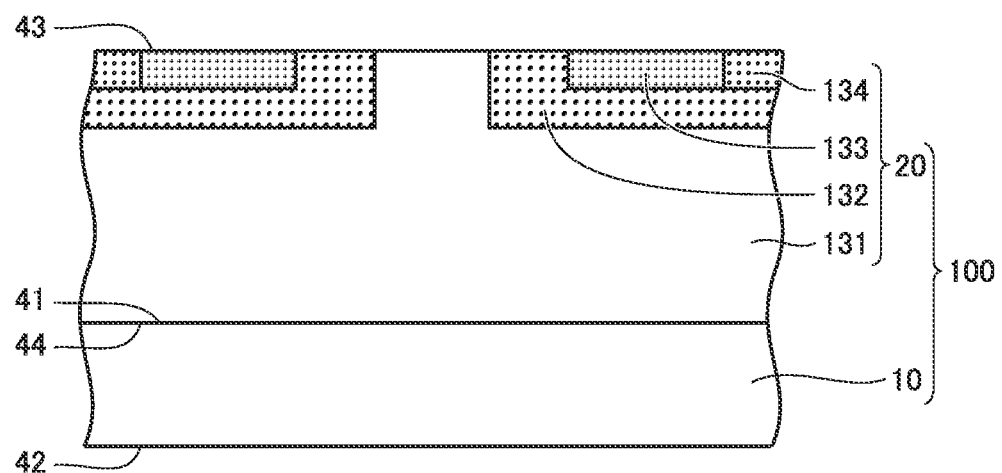
FIG. 14 is a schematic cross-sectional view showing a first step of the method for manufacturing the silicon carbide semiconductor device according to the present embodiment.

First, the ion implanting step (S21: FIG. 13) is performed. A p type impurity such as aluminum (Al) is implanted into third main surface 43 on which a mask (not shown) provided with an opening has been formed. A body region 132 having p type conductivity is thus formed. Next, an n type impurity such as phosphorus (P) is implanted into a predetermined position in body region 132. A source region 133 having n type conductivity is thus formed. Next, a p type impurity such as aluminum is implanted into a predetermined position in source region 133. A contact region 134 having p type conductivity is thus formed (see FIG. 14).

In silicon carbide layer 20, a portion other than body region 132, source region 133 and contact region 134 serves as a drift region 131. Source region 133 is separated from drift region 131 by body region 132. The ion implantation may be performed with silicon carbide epitaxial substrate 100 being heated at more than or equal to about 300° C. and less than or equal to about 600° C. After the ion implantation, activation annealing is performed on silicon carbide epitaxial substrate 100. The activation annealing activates the impurities implanted into silicon carbide layer 20, to generate carriers in each region. The activation annealing may be performed in an argon (Ar) atmosphere, for example. The activation annealing may be performed at a temperature of about 1800° C., for example. The activation annealing may be performed for a period of about 30 minutes, for example.

Figure 15:
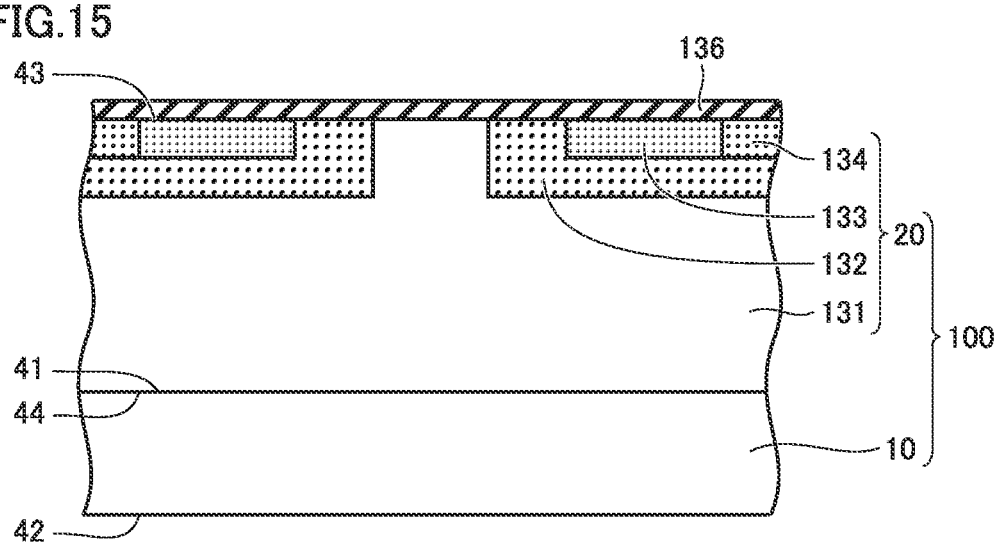
FIG. 15 is a schematic cross-sectional view showing a second step of the method for manufacturing the silicon carbide semiconductor device according to the present embodiment.

Next, the oxide film forming step (S22: FIG. 13) is performed. For example, silicon carbide epitaxial substrate 100 is heated in an atmosphere including oxygen, whereby oxide film 136 is formed on third main surface 43 (see FIG. 15). Oxide film 136 is composed of silicon dioxide ($SiO_2$) or the like, for example. Oxide film 136 functions as a gate insulating film. The thermal oxidation process may be performed at a temperature of about 1300° C., for example. The thermal oxidation process may be performed for a period of about 30 minutes, for example.

After oxide film 136 has been formed, heat treatment may be further performed in a nitrogen atmosphere. For example, the heat treatment may be performed at about 1100° C. for about one hour in an atmosphere of nitrogen monoxide (NO), nitrous oxide ($N_2O$), or the like. Further, heat treatment may be thereafter performed in an argon atmosphere. For example, the heat treatment may be performed at about 1100 to 1500° C. for about one hour in an argon atmosphere.

Next, the electrode forming step (S23: FIG. 13) is performed. A first electrode 141 is formed on oxide film 136. First electrode 141 functions as a gate electrode. First electrode 141 is formed by CVD, for example. First electrode 141 is composed of polysilicon or the like that contains an impurity and has conductivity, for example. First electrode 141 is formed at a position facing source region 133 and body region 132.

Next, an interlayer insulating film 137 is formed to cover first electrode 141. Interlayer insulating film 137 is formed by CVD, for example. Interlayer insulating film 137 is composed of silicon dioxide or the like, for example. Interlayer insulating film 137 is formed in contact with first electrode 141 and oxide film 136. Next, oxide film 136 and interlayer insulating film 137 at a prescribed position are removed by etching. Source region 133 and contact region 134 are thus exposed at oxide film 136.

A second electrode 142 is formed on the exposed portion by sputtering, for example. Second electrode 142 functions as a source electrode. Second electrode 142 is composed of titanium, aluminum, silicon and the like, for example. After second electrode 142 has been formed, second electrode 142 and silicon carbide epitaxial substrate 100 are heated at a temperature of about 900 to 1100° C., for example. Second electrode 142 and silicon carbide epitaxial substrate 100 are thus brought into ohmic contact with each other. Next, an interconnection layer 138 is formed in contact with second electrode 142. Interconnection layer 138 is composed of a material including aluminum, for example.

Next, a third electrode 143 is formed on second main surface 42. Third electrode 143 functions as a drain electrode. Third electrode 143 is composed of, for example an alloy including nickel and silicon (for example, NiSi or the like).

Figure 16:
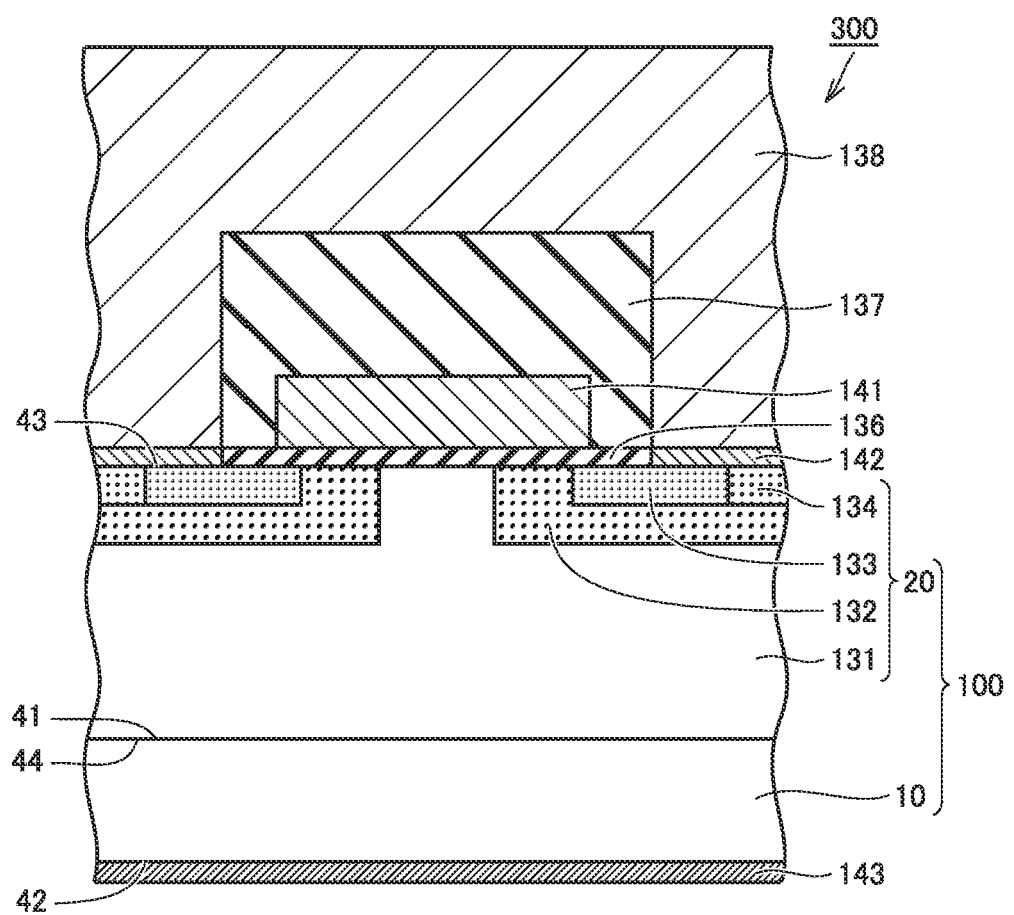
FIG. 16 is a schematic cross-sectional view showing a third step of the method for manufacturing the silicon carbide semiconductor device according to the present embodiment.

Next, the dicing step (S24: FIG. 13) is performed. For example, silicon carbide epitaxial substrate 100 is diced along a dicing line, whereby silicon carbide epitaxial substrate 100 is divided into a plurality of semiconductor chips. Silicon carbide semiconductor device 300 is manufactured in this manner (see FIG. 16).

Although the method for manufacturing the silicon carbide semiconductor device according to the present disclosure has been described above with reference to a MOSFET as an example, the manufacturing method according to the present disclosure is not limited as such. The manufacturing method according to the present disclosure is applicable to various types of silicon carbide semiconductor devices such as an IGBT (Insulated Gate Bipolar Transistor), a SBD (Schottky Barrier Diode), a thyristor, a GTO (Gate Turn Off thyristor), and a PiN diode.

(Evaluation)
(Preparation of Samples)

Manufacturing apparatus 200 of batch type shown in FIGS. 1 to 3 was used to simultaneously manufacture three silicon carbide epitaxial substrates 100 according to each of samples 1 to 10. The area of substrate placement surface 211 of susceptor 210 was set to 929 $cm^2$. The cross-sectional area of reaction chamber 201 was set to 176 $cm^2$. Silicon carbide epitaxial substrates 100 according to samples 1 to 7 are samples of examples. Silicon carbide epitaxial substrates 100 according to samples 8 to 10 are samples of comparative examples.

As shown in Table 1, in the methods for manufacturing silicon carbide epitaxial substrates 100 according to samples 1 to 10, the $H_2$ flow rate was set to 134 slm, and the $SiH_4$ flow rate was changed to change the $SiH_4$ flow rate/$H_2$ flow rate. In the methods for manufacturing silicon carbide epitaxial substrates 100 according to samples 1 to 10, the $SiH_4$ flow rate was set to 51.0 sccm, 92.6 sccm, 237.4 sccm, 51.0 sccm, 92.6 sccm, 237.4 sccm, 92.6 sccm, 92.6 sccm, 35.7 sccm and 92.6 sccm, respectively. In the methods for manufacturing silicon carbide epitaxial substrates 100 according to samples 1 to 10, the $NH_3$ flow rate was set to 0.0019 sccm, 0.0028 sccm, 0.0032 sccm, 0.0573 sccm, 0.0849 sccm, 0.0964 sccm, 0.0283 sccm, 0.1415 sccm, 0.0107 sccm and 0.0020 sccm, respectively.

In the methods for manufacturing silicon carbide epitaxial substrates 100 according to samples 1 to 10, the $SiH_4$ flow rate/$H_2$ flow rate was set to 0.038%, 0.069%, 0.177%, 0.038%, 0.069%, 0.177%, 0.069%, 0.069%, 0.027% and 0.069%, respectively. In the methods for manufacturing silicon carbide epitaxial substrates 100 according to samples 1 to 10, the value obtained by dividing the $SiH_4$ flow rate/$H_2$ flow rate by the area of substrate placement surface 211 of susceptor 210 was set to $4.10 \times 10^{-7}$ $cm^{-2}$, $7.44 \times 10^{-7}$ $cm^{-2}$, $1.91 \times 10^{-6}$ $cm^{-2}$, $4.10 \times 10^{-7}$ $cm^{-2}$, $7.44 \times 10^{-7}$ $cm^{-2}$, $1.91 \times 10^{-6}$ $cm^{-2}$, $7.44 \times 10^{-7}$ $cm^{-2}$, $7.44 \times 10^{-7}$ $cm^{-2}$, $2.87 \times 10^{-7}$ $cm^{-2}$ and $7.44 \times 10^{-7}$ $cm^{-2}$, respectively.

TABLE 11

| Sample No. | $H_2$ [slm] | $SiH_4$ [sccm] | $SiH_4/H_2$ [%] | Susceptor Area [$cm^2$] | $(SiH_4/H_2)$/ Susceptor Area [$cm^{-2}$] | Reaction Chamber Cross-Sectional Area [$cm^2$] | $(SiH_4/H_2)$/ Reaction Chamber Cross-Sectional Area [$cm^{-2}$] | $NH_3$ [sccm] |
|---|---|---|---|---|---|---|---|---|
| Sample 1 | 134 | 51.0 | 0.038% | 929 | $4.10 \times 10^{-7}$ | 176 | $2.16 \times 10^{-6}$ | 0.0019 |
| Sample 2 | 134 | 92.6 | 0.069% | 929 | $7.44 \times 10^{-7}$ | 176 | $3.93 \times 10^{-6}$ | 0.0028 |
| Sample 3 | 134 | 237.4 | 0.177% | 929 | $1.91 \times 10^{-6}$ | 176 | $1.01 \times 10^{-5}$ | 0.0032 |
| Sample 4 | 134 | 51.0 | 0.038% | 929 | $4.10 \times 10^{-7}$ | 176 | $2.16 \times 10^{-6}$ | 0.0573 |
| Sample 5 | 134 | 92.6 | 0.069% | 929 | $7.44 \times 10^{-7}$ | 176 | $3.93 \times 10^{-6}$ | 0.0849 |
| Sample 6 | 134 | 237.4 | 0.177% | 929 | $1.91 \times 10^{-6}$ | 176 | $1.01 \times 10^{-5}$ | 0.0964 |
| Sample 7 | 134 | 92.6 | 0.069% | 929 | $7.44 \times 10^{-7}$ | 176 | $3.93 \times 10^{-6}$ | 0.0283 |
| Sample 8 | 134 | 92.6 | 0.069% | 929 | $7.44 \times 10^{-7}$ | 176 | $3.93 \times 10^{-6}$ | 0.1415 |

TABLE 11-continued

| Sample No. | $H_2$ [slm] | $SiH_4$ [sccm] | $SiH_4/H_2$ [%] | Susceptor Area [cm$^2$] | $(SiH_4/H_2)$/ Susceptor Area [cm$^{-2}$] | Reaction Chamber Cross- Sectional Area [cm$^2$] | $(SiH_4/H_2)$/ Reaction Chamber Cross- Sectional Area [cm$^{-2}$] | $NH_3$ [sccm] |
|---|---|---|---|---|---|---|---|---|
| Sample 9 | 134 | 35.7 | 0.027% | 929 | $2.87 \times 10^{-7}$ | 176 | $1.51 \times 10^{-6}$ | 0.0107 |
| Sample 10 | 134 | 92.6 | 0.069% | 929 | $7.44 \times 10^{-7}$ | 176 | $3.93 \times 10^{-6}$ | 0.0020 |

(Measurement)

The carrier concentration in silicon carbide layer 20 of silicon carbide epitaxial substrate 100 according to each of samples 1 to 10 was measured by a mercury probe type C-V measuring device. The carrier concentration was measured in a region extending by at most 60 mm in radius from the center of third main surface 43. The carrier concentration was measured at a plurality of positions located at substantially regular intervals on a straight line passing through the center of third main surface 43 and parallel to the radial direction, and on a straight line perpendicular to this straight line. Specifically, the carrier concentration was measured at the center of third main surface 43, and at positions spaced by 10 mm, 20 mm, 30 mm, 40 mm, 50 mm and 60 mm from the center in the radial direction. The carrier concentration was measured at a total of 25 locations. The average value of the carrier concentration is an arithmetic mean of measured values at these 25 locations. The in-plane uniformity of the carrier concentration is a representation, in percentage, of a value obtained by dividing the standard deviation of the carrier concentration by the average value of the carrier concentration. Note that the probe at the mercury side had an area of 0.01 cm$^2$.

A root-mean-square deviation (Sq) in a central region of third main surface 43 was measured with a white-light interference microscope. A region for which the root-mean-square deviation was measured was a square region having each side of 250 μm. The root-mean-square deviation was measured at the center of third main surface 43, and at a position spaced by 50 mm from the center in the radial direction. The root-mean-square deviation was measured at a total of two locations. The root-mean-square deviation (Sq) of third main surface 43 was used for morphology of third main surface 43.

(Results)

Figure 17:
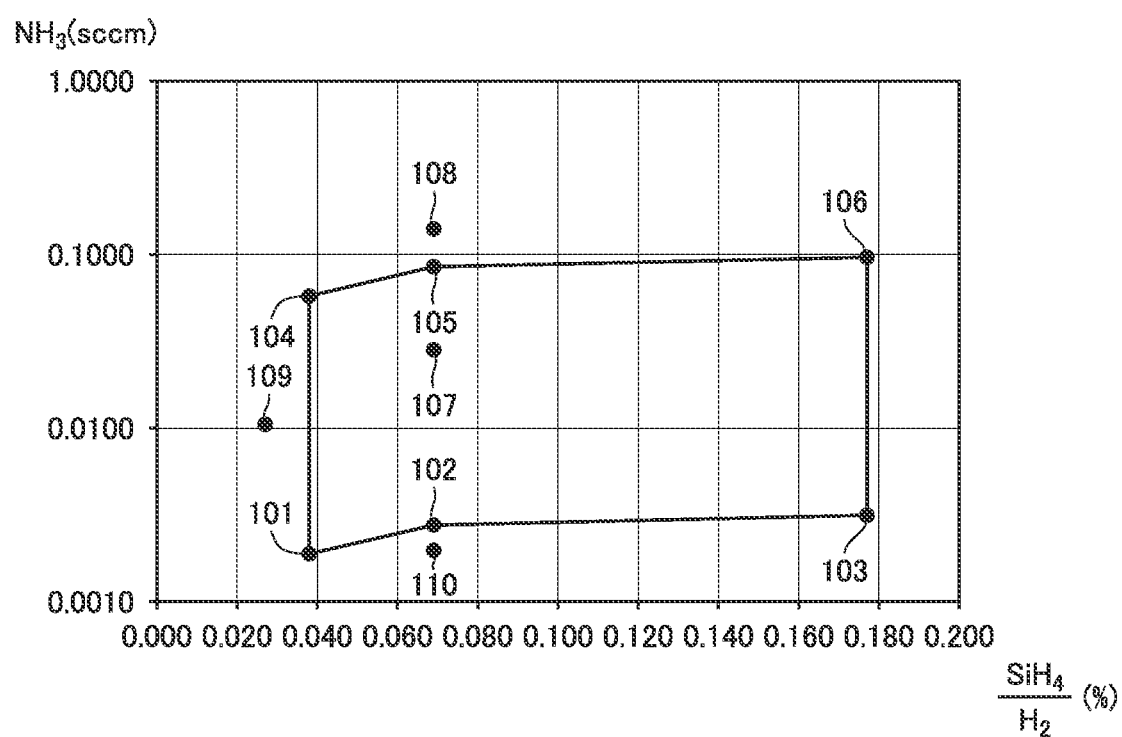
FIG. 17 shows a relation between a $SiH_4$ flow rate/$H_2$ flow rate and a $NH_3$ flow rate in a method for manufacturing a silicon carbide epitaxial substrate according to each evaluation sample.
Figure 18:
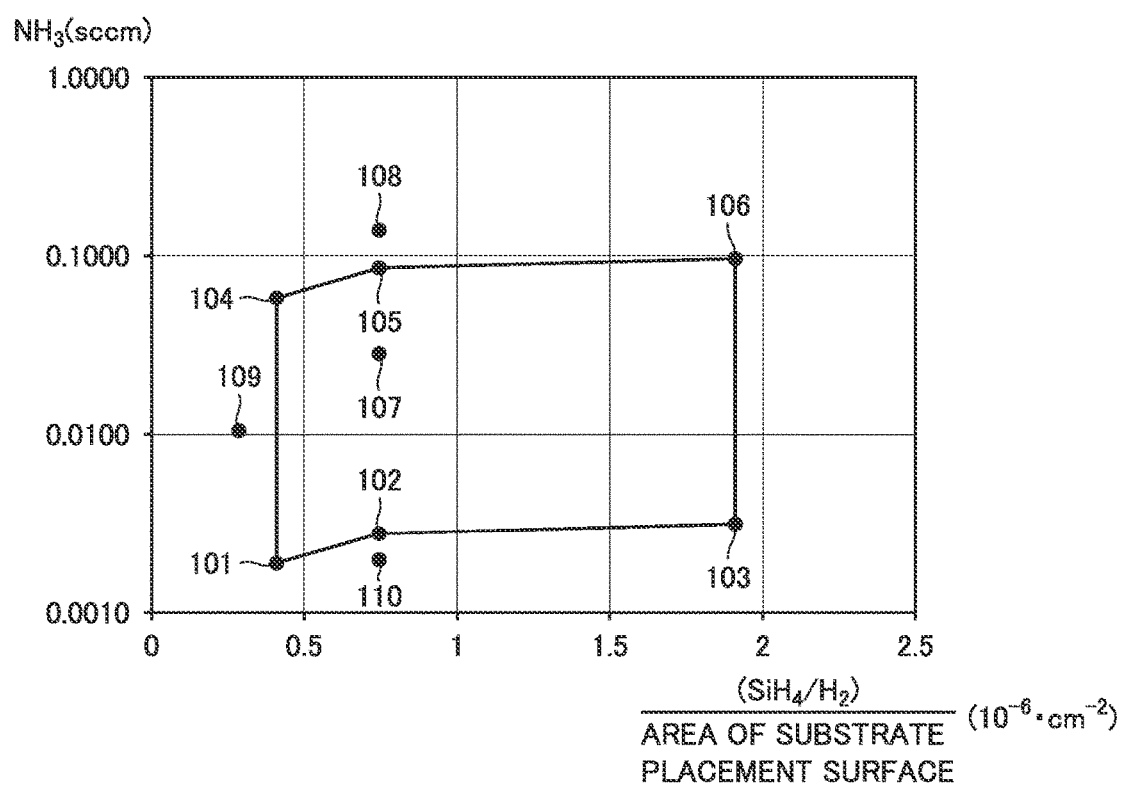
FIG. 18 shows a relation between a value obtained by dividing the ($SiH_4$ flow rate/$H_2$ flow rate) by an area of a substrate placement surface and the $NH_3$ flow rate in the method for manufacturing the silicon carbide epitaxial substrate according to each evaluation sample.

FIGS. 17 and 18 show manufacturing conditions for silicon carbide epitaxial substrates 100 according to samples 1 to 10. Coordinates 101 to 110 correspond to the manufacturing conditions for silicon carbide epitaxial substrates 100 according to samples 1 to 10, respectively.

TABLE 2

| | Substrate A | | | Substrate B | | | Substrate C | | |
|---|---|---|---|---|---|---|---|---|---|
| Sample No. | Average Carrier Concentration (cm$^{-3}$) | Carrier Concentration Uniformity (%) | Morphology <Sq> (nm) | Average Carrier Concentration (cm$^{-3}$) | Carrier Concentration Uniformity (%) | Morphology <Sq> (nm) | Average Carrier Concentration (cm$^{-3}$) | Carrier Concentration Uniformity (%) | Morphology <Sq> (nm) |
| Sample 1 | $1.1 \times 10^{15}$ | 8.2 | 0.1 | $1.0 \times 10^{15}$ | 8.6 | 0.2 | $1.0 \times 10^{15}$ | 8.4 | 0.3 |
| Sample 2 | $1.0 \times 10^{15}$ | 8.5 | 0.2 | $1.0 \times 10^{15}$ | 8.2 | 0.2 | $1.1 \times 10^{15}$ | 8.3 | 0.2 |
| Sample 3 | $1.1 \times 10^{15}$ | 8.4 | 0.3 | $1.1 \times 10^{15}$ | 8.2 | 0.4 | $1.0 \times 10^{15}$ | 8.3 | 0.3 |
| Sample 4 | $3.0 \times 10^{15}$ | 6.8 | 0.3 | $2.9 \times 10^{15}$ | 6.8 | 0.2 | $3.0 \times 10^{15}$ | 6.9 | 0.4 |
| Sample 5 | $3.0 \times 10^{15}$ | 6.2 | 0.3 | $3.0 \times 10^{15}$ | 6.2 | 0.4 | $3.0 \times 10^{15}$ | 6.4 | 0.4 |
| Sample 6 | $1.1 \times 10^{15}$ | 6.3 | 0.2 | $3.1 \times 10^{15}$ | 6.4 | 0.3 | $3.0 \times 10^{15}$ | 6.6 | 0.2 |
| Sample 7 | $1.0 \times 10^{16}$ | 7.5 | 0.3 | $9.9 \times 10^{15}$ | 7.6 | 0.2 | $1.0 \times 10^{16}$ | 7.5 | 0.3 |
| Sample 8 | $5.1 \times 10^{16}$ | 15.8 | 0.2 | $5.1 \times 10^{16}$ | 15.5 | 0.4 | $5.1 \times 10^{16}$ | 16.2 | 0.2 |
| Sample 9 | $8.0 \times 10^{15}$ | 8.1 | 0.7 | $7.9 \times 10^{15}$ | 8.2 | 0.7 | $8.0 \times 10^{15}$ | 7.9 | 0.6 |
| Sample 10 | $7.0 \times 10^{14}$ | 16.2 | 0.4 | $7.0 \times 10^{14}$ | 16.4 | 0.2 | $7.0 \times 10^{14}$ | 16.2 | 0.2 |

As shown in Table 2, the in-plane uniformities of the carrier concentrations in silicon carbide layers 20 of silicon carbide epitaxial substrates 100 (substrates A) according to samples 1 to 10 were 8.2%, 8.5%, 8.4%, 6.8%, 6.2%, 6.3%, 7.5%, 15.8%, 8.1% and 16.2%, respectively. The root-mean-square deviations (Sq) of the third surfaces of silicon carbide layers 20 of silicon carbide epitaxial substrates 100 (substrates A) according to samples 1 to 10 were 0.1 nm, 0.2 nm, 0.3 nm, 0.3 nm, 0.3 nm, 0.2 nm, 0.3 nm, 0.2 nm, 0.7 nm and 0.4 nm, respectively. Further, the average carrier concentrations in silicon carbide layers 20 of silicon carbide epitaxial substrates 100 (substrates A) according to samples 1 to 10 were $1.1 \times 10^{15}$ cm$^{-3}$, $1.0 \times 10^{15}$ cm$^{-3}$, $1.1 \times 10^{15}$ cm$^{-3}$, $3.0 \times 10^{15}$ cm$^{-3}$, $3.0 \times 10^{15}$ cm$^{-3}$, $3.1 \times 10^{15}$ cm$^{-3}$, $1.0 \times 10^{16}$ cm$^{-3}$, $5.1 \times 10^{16}$ cm$^{-3}$, $8.0 \times 10^{15}$ cm$^{-3}$ and $7.0 \times 10^{14}$ cm$^{-3}$, respectively.

As shown in Table 2, the in-plane uniformities of the carrier concentrations in silicon carbide layers 20 of silicon carbide epitaxial substrates 100 (substrates B) according to samples 1 to 10 were 8.6%, 8.2%, 8.2%, 6.8%, 6.2%, 6.4%, 7.6%, 15.5%, 8.2% and 16.4%, respectively. The root-mean-square deviations (Sq) of the third surfaces of silicon carbide layers 20 of silicon carbide epitaxial substrates 100 (substrates B) according to samples 1 to 10 were 0.2 nm, 0.2 nm, 0.4 nm, 0.2 nm, 0.4 nm, 0.3 nm, 0.2 nm, 0.4 nm, 0.7 nm and 0.2 nm, respectively. Further, the average carrier concentrations in silicon carbide layers 20 of silicon carbide epitaxial substrates 100 (substrates B) according to samples 1 to 10 were $1.0 \times 10^{15}$ cm$^{-3}$, $1.0 \times 10^{15}$ cm$^{-3}$, $1.1 \times 10^{15}$ cm$^{-3}$, $7.9 \times 10^{15}$ cm$^{-3}$, $3.0 \times 10^{15}$ cm$^{-3}$, $3.1 \times 10^{15}$ cm$^{-3}$, $9.9 \times 10^{15}$ cm$^{-3}$, $5.1 \times 10^{16}$ cm$^{-3}$, $7.9 \times 10^{15}$ cm$^{-3}$ and $7.0 \times 10^{14}$ cm$^{-3}$, respectively.

As shown in Table 2, the in-plane uniformities of the carrier concentrations in silicon carbide layers 20 of silicon carbide epitaxial substrates 100 (substrates C) according to samples 1 to 10 were 8.4%, 8.3%, 8.3%, 6.9%, 6.4%, 6.6%, 7.5%, 16.2%, 7.9% and 16.2%, respectively. The root-mean-square deviations (Sq) of the third surfaces of silicon carbide layers 20 of silicon carbide epitaxial substrates 100 (substrates C) according to samples 1 to 10 were 0.3 nm, 0.2 nm, 0.3 nm, 0.4 nm, 0.4 nm, 0.2 nm, 0.3 nm, 0.2 nm, 0.6 nm and 0.2 nm, respectively. Further, the average carrier concentrations in silicon carbide layers 20 of silicon carbide epitaxial substrates 100 (substrates C) according to samples 1 to 10 were $1.0 \times 10^{15}$ cm$^{-3}$, $1.1 \times 10^{15}$ cm$^{-3}$, $1.0 \times 10^{15}$ cm$^{-3}$, $3.0 \times 10^{15}$ cm$^{-3}$, $3.0 \times 10^{15}$ cm$^{-3}$, $3.0 \times 10^{15}$ cm$^{-3}$, $1.0 \times 10^{16}$ cm$^{-3}$, $5.1 \times 10^{16}$ cm$^{-3}$, $8.0 \times 10^{15}$ cm$^{-3}$ and $7.0 \times 10^{14}$ cm$^{-3}$, respectively.

It should be understood that the embodiments and examples disclosed herein are illustrative and non-restrictive in every respect. The scope of the present invention is defined by the terms of the claims rather than the embodiments described above, and is intended to include any modifications within the meaning and scope equivalent to the terms of the claims.

REFERENCE SIGNS LIST 10 silicon carbide single-crystal substrate; 20 silicon carbide layer; 41 first main surface; 42 second main surface; 43 third main surface; 44 fourth main surface; 100 silicon carbide epitaxial substrate; 101 to 110 coordinate; 131 drift region; 132 body region; 133 source region; 134 contact region; 136 oxide film; 137 interlayer insulating film; 138 interconnection layer; 141 first electrode; 142 second electrode; 143 third electrode; 200 manufacturing apparatus; 201 reaction chamber; 202 stage; 203 heating element; 204 quartz tube; 205 inner wall surface; 206 gas supply hole; 207 gas inlet; 208 gas outlet; 209 rotation shaft; 210 susceptor; 211 placement surface; 212 bottom surface; 213 placement portion; 214 top surface; 215 side surface; 216 center; 231 first gas supplier; 232 second gas supplier; 233 third gas supplier; 234 carrier gas supplier; 235 gas supplier; 241 first gas flow rate controller; 242 second gas flow rate controller; 243 third gas flow rate controller; 244 carrier gas flow rate controller; 245 controller; 250 diameter; 300 silicon carbide semiconductor device.

The invention claimed is:

1. A method for manufacturing a silicon carbide epitaxial substrate, the method comprising:
preparing
a susceptor having a substrate placement surface,
a silicon carbide single-crystal substrate having a first main surface and a second main surface opposite to the first main surface, and
a reaction chamber in which the susceptor is disposed;
placing the silicon carbide single-crystal substrate on the substrate placement surface such that the second main surface faces the substrate placement surface; and
forming a silicon carbide layer on the first main surface by supplying a mixed gas including carbon atoms, silane, ammonia and hydrogen to the reaction chamber, wherein
the first main surface is a (000-1) plane or a plane inclined by an angle of less than or equal to 8° relative to the (000-1) plane,
the substrate placement surface has an area of more than or equal to 697 cm$^2$ and less than or equal to 1161 cm$^2$,
in the forming of the silicon carbide layer, when an X axis indicates a first value representing, in percentage, a value obtained by dividing a flow rate of the silane by a flow rate of the hydrogen, and a Y axis indicates a second value representing a flow rate of the ammonia in sccm, the first value and the second value fall within a hexagonal region surrounded by first coordinates, second coordinates, third coordinates, fourth coordinates, fifth coordinates and sixth coordinates in XY plane coordinates,
the first coordinates are (0.038, 0.0019),
the second coordinates are (0.069, 0.0028),
the third coordinates are (0.177, 0.0032),
the fourth coordinates are (0.038, 0.0573),
the fifth coordinates are (0.069, 0.0849),
the sixth coordinates are (0.177, 0.0964), and
after the forming of the silicon carbide layer, an average value of carrier concentration in the silicon carbide layer is more than or equal to $1 \times 10^{15}$ cm$^{-3}$ and less than or equal to $3 \times 10^{16}$ cm$^{-3}$.

2. A method for manufacturing a silicon carbide epitaxial substrate, the method comprising:
preparing
a susceptor having a substrate placement surface,
a silicon carbide single-crystal substrate having a first main surface and a second main surface opposite to the first main surface, and
a reaction chamber in which the susceptor is disposed;
placing the silicon carbide single-crystal substrate on the substrate placement surface such that the second main surface faces the substrate placement surface; and
forming a silicon carbide layer on the first main surface by supplying a mixed gas including carbon atoms, silane, ammonia and hydrogen to the reaction chamber, wherein
the first main surface is a (000-1) plane or a plane inclined by an angle of less than or equal to 8° relative to the (000-1) plane,
the substrate placement surface has an area of more than or equal to 697 cm$^2$ and less than or equal to 1161 cm$^2$,
in the forming of the silicon carbide layer, when an X axis indicates a first value representing, in cm$^{-2}$, a value obtained by dividing a value, which is obtained by dividing a flow rate of the silane by a flow rate of the hydrogen, by the area, and a Y axis indicates a second value representing a flow rate of the ammonia in sccm, the first value and the second value fall within a hexagonal region surrounded by first coordinates, second coordinates, third coordinates, fourth coordinates, fifth coordinates and sixth coordinates in XY plane coordinates,
the first coordinates are ($4.10 \times 10^{-7}$, 0.0019),
the second coordinates are ($7.44 \times 10^{-7}$, 0.0028),
the third coordinates are ($1.91 \times 10^{-6}$, 0.0032),
the fourth coordinates are ($4.10 \times 10^{-7}$, 0.0573),
the fifth coordinates are ($7.44 \times 10^{-7}$, 0.0849),
the sixth coordinates are ($1.91 \times 10^{-6}$, 0.0964), and
after the forming of the silicon carbide layer, an average value of carrier concentration in the silicon carbide layer is more than or equal to $1 \times 10^{15}$ cm$^{-3}$ and less than or equal to $3 \times 10^{16}$ cm$^{-3}$.

3. A method for manufacturing a silicon carbide semiconductor device, the method comprising:
preparing the silicon carbide epitaxial substrate manufactured with the method according to claim 1; and
processing the silicon carbide epitaxial substrate.

4. A method for manufacturing a silicon carbide semiconductor device, the method comprising:
 preparing the silicon carbide epitaxial substrate manufactured with the method according to claim 2; and
 processing the silicon carbide epitaxial substrate.

* * * * *